United States Patent [19]

Owen et al.

[11] 4,263,664

[45] Apr. 21, 1981

[54] NONVOLATILE STATIC RANDOM ACCESS MEMORY SYSTEM

[75] Inventors: William H. Owen, Mountain View; Richard T. Simko, Los Altos; Wallace E. Tchon, Sunnyvale, all of Calif.

[73] Assignee: Xicor, Inc., Sunnyvale, Calif.

[21] Appl. No.: 71,499

[22] Filed: Aug. 31, 1979

[51] Int. Cl.³ .............................................. G11C 11/40
[52] U.S. Cl. .................................... 365/185; 365/230
[58] Field of Search ............... 365/182, 184, 185, 189, 365/226, 230; 307/238

[56] References Cited

U.S. PATENT DOCUMENTS 4,128,773  12/1978  Troutman ........................... 365/185

Primary Examiner—Terrell W. Fears
Attorney, Agent, or Firm—Fitch, Even, Tabin, Flannery & Welsh

[57] ABSTRACT

Nonvolatile, integrated metal-oxide semiconductor random access memory systems utilizing integrated floating gate circuit elements, and integrated means for the generation and control of high voltages in the provision of self-contained, nonvolatile electrically-alterable static RAM circuit systems.

11 Claims, 22 Drawing Figures

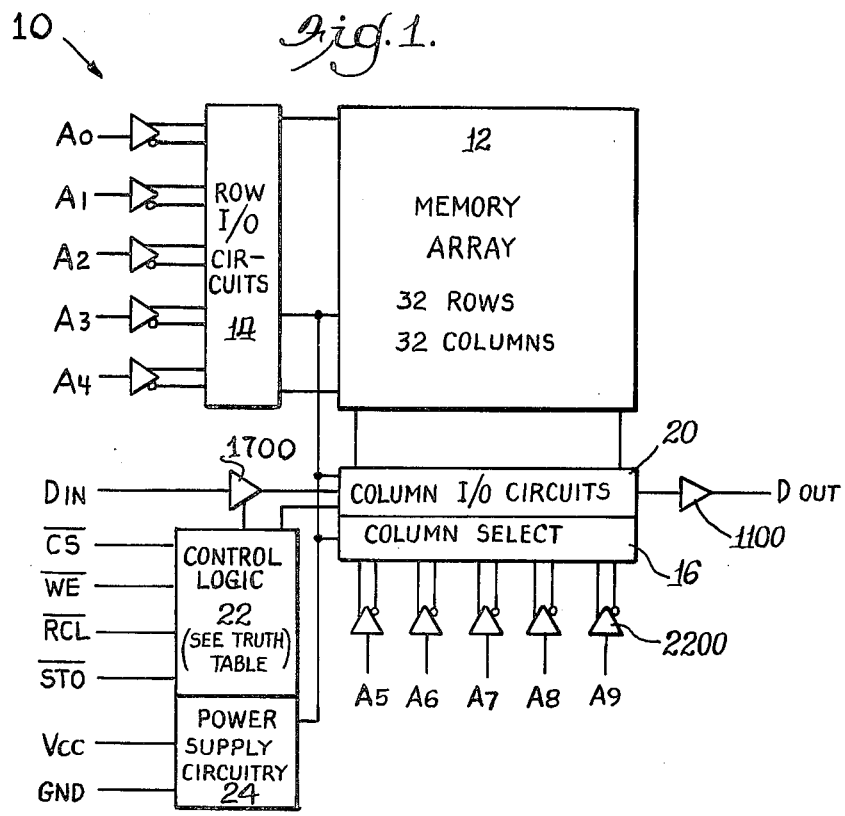

TRUTH TABLE

| CS | WE | DIN | RCL | STO | D OUT | MODE |
|---|---|---|---|---|---|---|
| H | X | X | X | X | HIGH Z | NOT SELECTED (1) (2) |
| L | L | L | H | H | HIGH Z | WRITE "0" RAM |
| L | L | H | H | H | HIGH Z | WRITE "1" RAM |
| L | H | X | L | H | HIGH Z | ARRAY RECALL OR BIT RECALL |
| L | H | X | H | L | HIGH Z | (2) NONVOLATILE STORING |
| L | H | X | H | H | D OUT | READING RAM |

NOTES:
(1) CHIP IS DESELECTED BUT MAY BE AUTOMATICALLY COMPLETING A STORE CYCLE
(2) $\overline{CS}$=L AND $\overline{STO}$=L ARE REQUIRED ONLY TO INITIATE THE STORE CYCLE, AFTER WHICH THE STORE CYCLE WILL BE AUTOMATICALLY COMPLETED ($\overline{CS}$=X AND $\overline{STO}$=X)

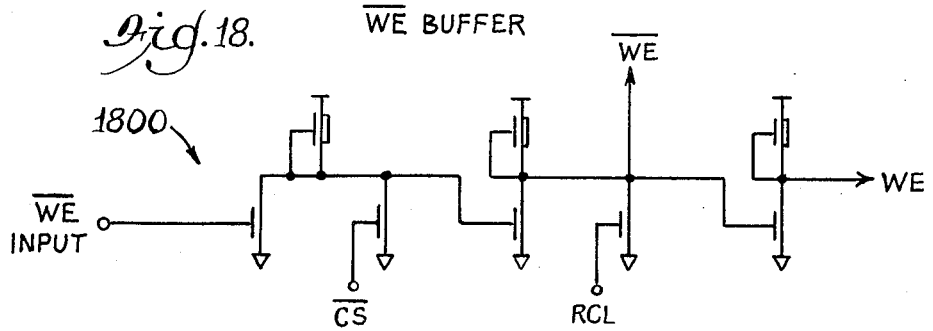
Fig. 18. WE BUFFER
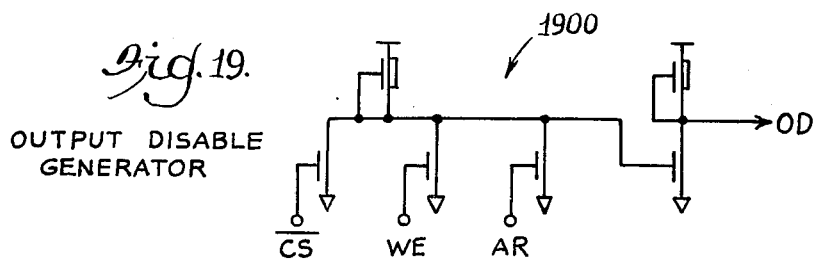
Fig. 19. OUTPUT DISABLE GENERATOR
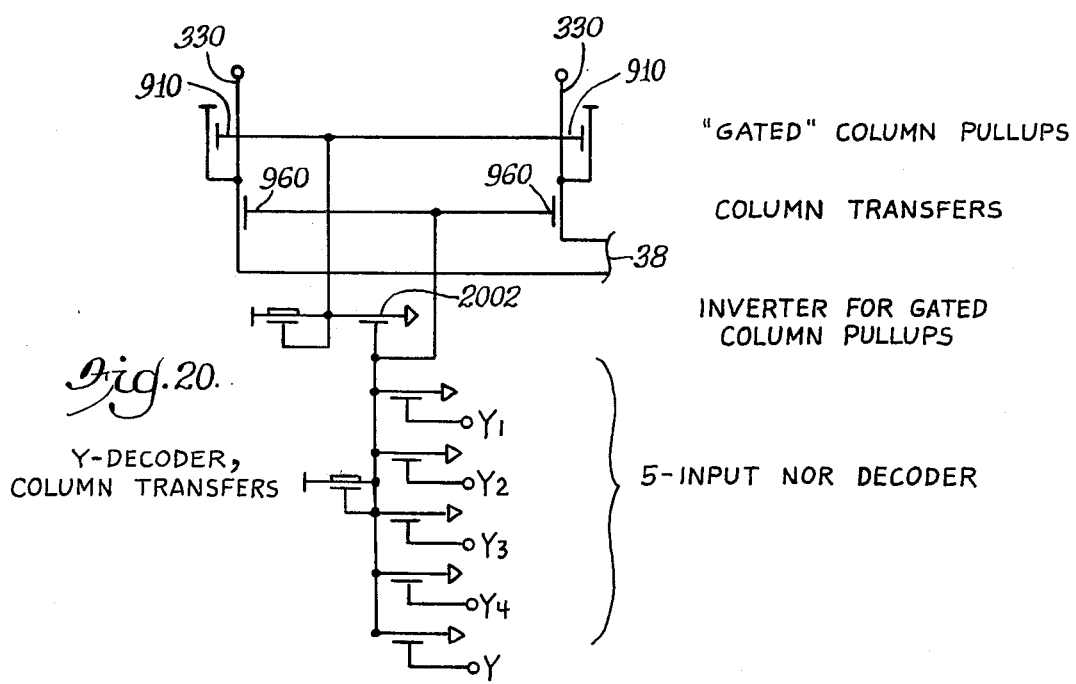
Fig. 20. Y-DECODER, COLUMN TRANSFERS

NONVOLATILE STATIC RANDOM ACCESS MEMORY SYSTEM

This application is related to copending applications Ser. Nos. 6,026, 6,029, and 6,030 all filed on Jan. 24, 1979.

The invention relates generally to the field of metal-oxide semiconductor random access memory systems (MOS RAM's), and more particularly to nonvolatile static RAM systems incorporating an integrated floating gate circuit element.

Many static RAMs employ bistable semiconductor circuits such as flip-flop circuits as memory cells for storing binary data (ones and zeros). For such static memory cells to store information, electrical current from an electrical power source must continually flow in one of the two cross-coupled circuit branches, and be relatively absent from the other branch. Two (binary) distinguishable memory states for information storage are thereby provided, depending upon which branch is conductive, and which branch is correspondingly nonconductive. Accordingly, such semiconductor memory cells are considered to be "volatile" because if electrical power is removed, memory state distinguishing current will cease to flow in the current carrying branch, and the information in the cell is accordingly lost. Such volatility is a substantial disadvantage of conventional semiconductor memory systems, and substantial effort in the art has been made to develop circuit elements and structures for providing nonvolatility to semiconductor circuits when power is removed [E. Harari, et al., "A 256-Bit Nonvolatile Static RAM," 1978 IEEE International Solid State Circuits Conference Digest, pp. 108–109; F. Berenga, et al., "E$^2$PROM TV Synthesizer," 1978 IEEE International Solid State Circuits Conference Digest, pp. 196–197; M. Horne, et al., "A Military Grade 1024-Bit Nonvolatile Semiconductor RAM," IEEE Trans. Electron Devices, Vol. ED-25, No. 8, (1978), pp. 1061–1065; Y. Uchida, et al., "1K Nonvolatile Semiconductor Read/Write RAM," IEEE Trans. Electron Devices, Vol. ED-25, No. 8, (1978), pp. 1065–1070; D. Frohmann, "A Fully-Decoded 2048-Bit Electrically Programmable MOS-ROM," 1971 IEEE International Solid State Circuits Conference Digest, pp. 80–81, U.S. Pat. No. 3,660,819; U.S. Pat. No. 4,099,196; U.S. Pat. No. 3,500,142; Dimaria, et al., "Interface Effects and High Conductivity in Oxides Grown from Polycrystalline Silicon," Applied Phys. Letters (1975), pp. 505–507; R. M. Anderson, et al., "Evidence for Surface Asperity Mechanism of Conductivity in Oxide Grown on Polycrystalline Silicon, "J. of Appl. Phys., Vol. 48, No. 11 (1977), pp. 4834–4836].

Devices based on the MOS floating gate structure are conventionally used for systems having prolonged data retention. A floating gate is an island of conducting material, electrically insulated from the substrate but capacitively coupled to the substrate, forming the gate of a MOS transistor. Depending on the presence or absence of charge on this floating gate, the MOS transistor will be rendered conductive ("on") or nonconductive ("off"), thus forming the basis for memory device storage of binary "1" or "0" data corresponding to the presence or absence of floating gate charge. Various means of introducing and removing the signal charge from the floating gate are known. Once the charge is on the gate, it remains permanently trapped, because the floating gate is completely surrounded by an insulating material which acts as a barrier to the discharging of the floating gate. Charge can be introduced onto the floating gate using hot electron injection and/or tunneling mechanisms. Charge can be removed from the floating gate by exposure to radiation (uv light, x-rays), avalanche injection, or by so-called tunneling effects. The term tunneling is used herein in a broad sense to include the emission of an electron from the surface of a conductor (including semiconductors) into an adjacent insulator through the energy barrier.

Nonvolatile static RAM memories are known which incorporate a floating gate nonvolatile element utilizing very thin gate oxide, but such devices have a number of disadvantages. Charge is tunneled to and from a floating gate element bidirectionally through a relatively thin (50 Angstroms–200 Angstroms) oxide which may be difficult to reliably manufacture with adequate integrity. Because of the bidirectional character of the very thin tunnel oxide, the nonvolatile RAM cell may be subject to possible disturb problems which cause the memory to lose its contents. In particular, such problems may involve limitations in the number of read cycles, and disturbances in the memory contents of a cell being caused by adjacent cell operations. Other nonvolatile RAM devices do not use floating gates but rather a metal nitride-oxide semiconductor structure in which charge is retained at a silicon nitride, silicon dioxide interface. However, such MNOS devices may also have disturb problems which limit not only write cycles but also read cycles, causing limitations on the widespread use of MNOS devices.

It is desirable to interface a nonvolatile element to a RAM circuit to provide nonvolatility in a semiconductor memory array. However, known interfaced devices have various substantial disadvantages. For example, such interfacing may be carried out by introducing a conductance imbalance caused by the nonvolatile element being directly placed between the two branches of a cross-coupled static RAM cell. However, such conductance imbalance causes the cross-coupled static RAM cell to carry a DC offset current which must be overcome when the cell is in normal RAM mode operation, and such imbalances can lead to read and write disturb marginalities for an overall memory circuit. Further, such marginalities present manufacturing yield limitations and testing problems.

Another important factor in respect of interfacing the nonvolatile elements to static RAM cells is providing compactness and simplicity to device design, as these factors affect circuit size and cost. Conventional interface systems unfortunately tend to require a complex interface in terms of control signals and extra transistors, which has resulted in large nonvolatile static RAM circuit size and correspondingly high cost.

Various conventional nonvolatile static RAM devices also tend to have the disadvantage of requiring high current demands and high voltages for operation. These requirements place practical limits on device power and speed, and complicate circuit design. Various known nonvolatile static RAM devices also tend to utilize the semiconductor substrate as the principal element in programming the nonvolatile memory components, which may involve application of high voltages and currents to the RAM power line to effect nonvolatile data storage, so that it is difficult to independently optimize and separate the RAM system design and fabrication process from the nonvolatile memory system design and fabrication process. The requirement for an external high voltage power supply and high currents adversely affect the cost, ease of use and general applicability of such conventional nonvolatile RAM memory systems.

Further, when data placed in the nonvolatile storage element is recalled to the RAM cell, the data may be applied to the RAM cell in a complement, or opposite state from that in which it was originally written into the nonvolatile element. Such complement state recall, rather than direct, true state recall, is a substantial inconvenience which must be handled by extra circuitry or otherwise accounted for by the user of the memory system. The combination of high cost and difficulty in use of such conventional nonvolatile RAM memory systems has restricted the usage of nonvolatile static random access memory systems.

Accordingly, it is an object of this invention to provide improved nonvolatile electrically-alterable static RAM integrated circuits which do not require an external high voltage supply or high current supply. It is a further object to provide such nonvolatile integrated random access memory circuits which may be adapted to utilize only conventional, external transistor-transistor logic (TTL) level controls.

It is another object to provide a nonvolatile, static RAM which may be adapted to draw substantially no DC current, during programming, from an internally generated high voltage supply. It is a further object to provide nonvolatile static RAM circuits including means for preventing inadvertent operation of the nonvolatile memory during chip powerup and powerdown. It is still another object to provide nonvolatile static RAM systems comprising means for selectively transferring data from an entire nonvolatile memory array of the integrated circuit system into a corresponding volatile static RAM array or for transferring a single data bit from a predetermined location of the nonvolatile memory to a predetermined corresponding location of the RAM, upon simple logic level command.

These and other objects of the invention will become apparent from the following detailed description and the accompanying drawings, of which FIG. 1 is a schematic block diagram of an embodiment of a 1024-bit nonvolatile electrically-alterable static random access memory array in accordance with the present invention;

FIG. 2 is the logic truth table for the control logic element of the embodiment as shown in FIG. 1;

FIG. 18 is a circuit diagram of the write enable buffer of the memory device of FIG. 1;

FIG. 19 is a circuit diagram of the output disable generator for the output circuitry of FIG. 11;

FIG. 20 is a circuit diagram of Y decoder, column circuitry for the memory circuit illustrated in FIG. 3;

Figure 3:
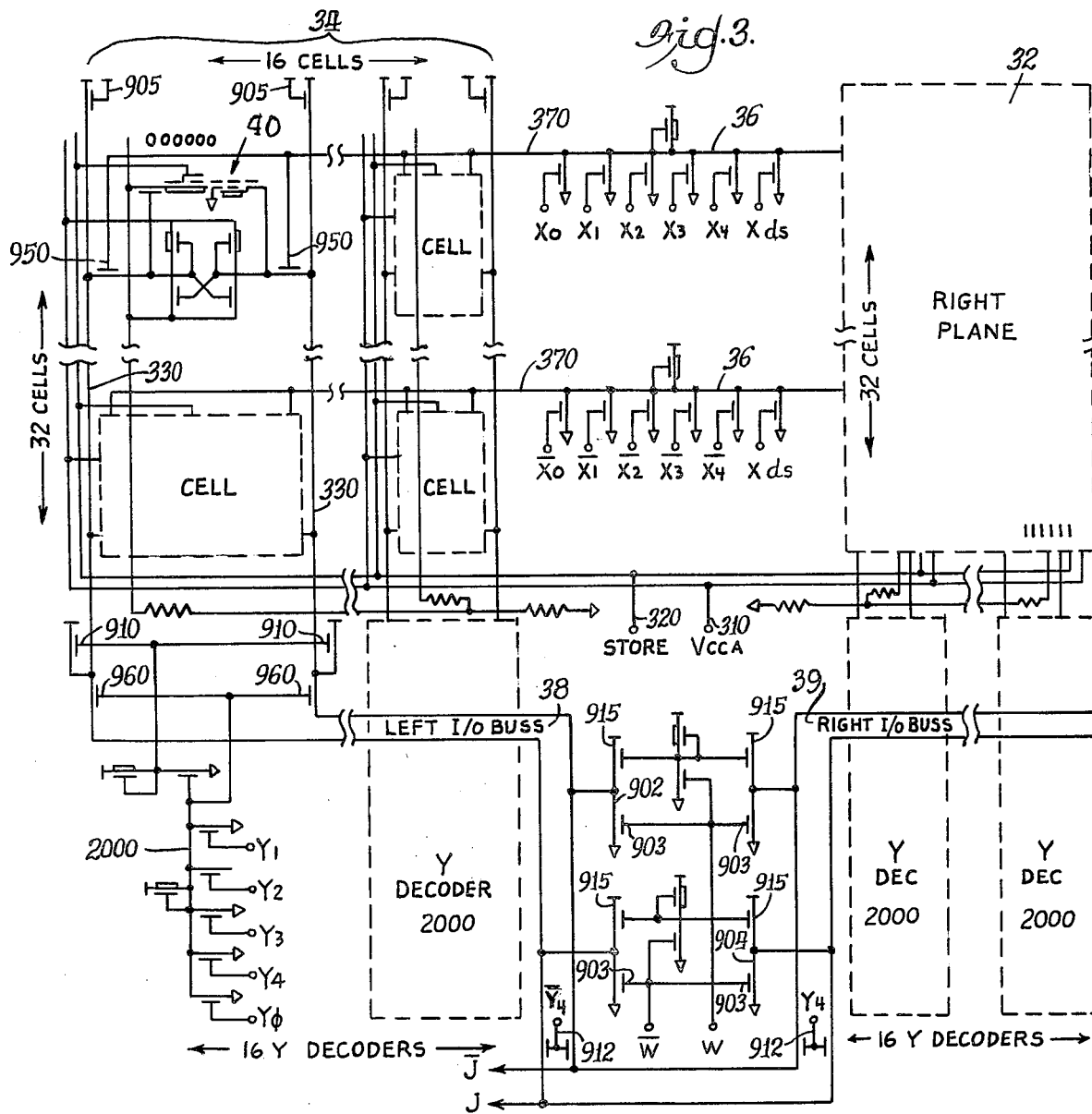
FIG. 3 is a circuit diagram illustrating the memory circuit organization of the random access memory array of FIG. 1.

Generally, in accordance with the present invention, nonvolatile, electrically alterable integrated circuit memory devices are provided which comprise an addressable volatile memory section and a nonvolatile memory section associated with the volatile memory section. The volatile memory section may comprise a plurality of addressable volatile random access memory cells for storing binary data. The nonvolatile memory section may comprise a plurality of nonvolatile memory cells associated with the volatile memory cells for substantially permanently storing data from the volatile memory cells as a stored charge condition, upon application of an appropriate store signal. The nonvolatile memory cells and the addressable random access memory cells are co-operably interrelated such that upon application of power to the random access memory cells, the memory states represented by the stored charge conditions of the respective nonvolatile memory cells are copied to the corresponding volatile memory cells. The random access memory cells and the corresponding nonvolatile memory elements are further co-operatively interrelated such that upon storage of initial memory state data from the volatile memory cells into the corresponding nonvolatile memory cells, and subsequent copying of the memory states of the nonvolatile memory cells to the corresponding volatile memory cells, the volatile cells will be returned to their respective initial memory states.

The volatile addressable random access memory cells may desirably be static MOS, four or six-transistor cross coupled, flip-flop circuit elements which utilize a relatively low level power supply voltage to retain a desired memory state. The copying of the memory states of the random access memory cells to the corresponding nonvolatile memory cells is generally carried out by application of a relatively high voltage control signal to the desired nonvolatile memory cell components. This control signal voltage will generally be greater and usually substantially greater than the operational voltage applied to the random access memory cells to maintain data storage therein. In accordance with the present invention, an internal, on-chip means for generating the relatively high voltage storage control signal for random access memory to nonvolatile memory copying is provided, which is adapted to utilize relatively low level input voltage signals such as TTL level signals in the provision of the higher voltage control signals utilized in the nonvolatile memory system.

The memory devices further include circuit means for determining whether external and internally generated power supplies of the memory devices are within a predetermined operable range and for preventing application of store control signal voltage to the nonvolatile memory elements if the external and internal power supply voltages are not within such ranges. Such means functions to prevent the loss of nonvolatile data due to inadvertent nonvolatile storage cycling. In this manner, loss of nonvolatile stored data by inadvertent storage signal application to the nonvolatile memory cells is prevented before proper, operational power supply levels have been reached, or may be inadequate, such as during chip power up or power down. Such circuitry means is an important element in the maintenance of the accuracy and integrity of nonvolatile data storage, and the concomitant reliability and functional simplicity of operation in appearance to external devices.

The memory devices further may comprise selectively operable means for automatically copying nonvolatile data from the nonvolatile means to the static random access memory in a predetermined manner. Such selectively operable copying may be carried out upon a plurality of memory locations, or may be adapted to copy a single selected nonvolatile memory cell to the corresponding addressable random access memory cell. The utilization of such means in the memory device may be adapted to provide for copying of an entire array or block of memory addresses of data from the nonvolatile memory to the random access memory under external operation or program control. Similarly, such selectively operable means may be adapted for copying a single nonvolatile data bit from selected nonvolatile memory cell to the corresponding random access memory cell. Multiple means may be provided for selectively copying blocks of data, or individual data bits, under external control.

The integrated circuit devices generally include I/O terminal means for inputting and outputting data to and from the devices, respectively. Desirably such I/O means will comprise separate input connection terminals for external electrical connection to the integrated circuit, which may be in the form of an individual device "chip", although shared (i.e., multiplexed) I/O means may be used. Further, rather than comprising one or more external pin connections, such I/O means may comprise means for communicating internally with other integrated circuit elements, when devices of the present invention are fabricated together with such other integrated circuit elements such as microprocessors, etc. The devices further include power supply terminal means for providing low level potential power supply to the device. By "low level" is meant MOS, ECL or TTL level power supply, which will generally not exceed about 12 volts, and preferably will not exceed about 5 volts in potential. The power supply terminal means may desirably comprise an external ground terminal for connection to internal device ground potential conductors, and an external dc voltage terminal for application of an appropriate operational low level dc voltage for device operation. For example, for devices fabricated in n-channel MOS design configurations using a monocrystalline silicon substrate, a ground pin and a +5 volt dc power source pin may desirably be utilized.

The integrated memory devices may further include a back bias power supply terminal, or an internal back bias generating circuit for generating a bias voltage and operation of the circuitry of the memory device, which may reduce the pin voltage power supply requirement to the integrated circuit memory device.

As indicated, the copying of the memory state of a volatile memory cell to a corresponding, associated nonvolatile memory cell as a charge storage state of the nonvolatile cell, involves the application of a signal pulse having a potential which may be substantially in excess of the potential of the low level power supply provided to the integrated circuit device. In this regard, the device further includes high voltage generator means for utilizing the low level power supply for generating a high voltage signal pulse for effecting transfer of data from the volatile memory cells of the memory to nonvolatile cells of the memory. The nonvolatile memory cells store information as a charge (or potential) state on a dielectrically insulated floating gate structure, and the high voltage provided by the generator means is utilized in the transfer of charge to or from the floating gate across the dielectric barrier. The devices of the invention are also provided with terminal means for providing an external control signal to initiate transfer of data to the nonvolatile cells from the volatile cells, and the high voltage generator may be made responsive to an appropriate signal applied to such terminal to generate a high voltage data transfer pulse upon appropriate command signal applied thereto. The high voltage generator means is however, desirably further responsive to the power supply sense means, such that it will not provide a high voltage pulse to the nonvolatile memory cells in the event the external power supply is not in a predetermined operable range.

It will be appreciated that in accordance with the present invention, a substantially self-contained, reliable, nonvolatile memory device is provided in which all external control signals may be relatively low level power supply and logic signals such as conventional transistor-transistor logic (TTL) signals and power supplies.

In accordance with the invention, an array of nonvolatile electrically alterable elements may be provided in a single integrated circuit which can be completely controlled by logic level signals, and which do not require external high voltage power supplies or control signals. In this connection, complete electrically alterable nonvolatile memory devices in accordance with the invention may be provided which operate solely from TTL level (e.g., 0.8 to 2.2 volt), ECL level (e.g., 2.1±0.7 volts), or high level MOS (e.g., 0–5 volts, or 0–12 volts) external control signals. The integrated random access memory circuitry (RAM) may be adapted to specifically recall any single bit selected from the integrated nonvolatile memory ($E^2$PROM), or the entire array from the nonvolatile $E^2$PROM memory may be copied to the RAM memory upon simple TTL or other low level command. Furthermore, as indicated, the RAM memory of the self-contained memory circuit is adapted to always powerup with the contents of the nonvolatile E²PROM upon application of power of the chip. Further in accordance with the invention, the integrated memory circuit is protected from inadvertent change of the nonvolatile data by a circuit means which precludes memory operation unless externally applied power supplies and internally generated power supplies have reached appropriate predetermined levels to guarantee proper controlled operation. This precludes nonvolatile memory loss when, for example, powerup or (intentional or unintentional) powerdown occurs. The high-voltage generator, control circuits, and internal protection circuits have use in other applications other than RAMs, such as nonvolatile electrically-alterable ROM devices, any memory devices, and micro-computers, as will become apparent from the present disclosure.

Turning now to the drawings, the present invention will be further described with respect to the embodiment 10 illustrated in FIGS. 1–22. In this connection, FIG. 1 is a block diagram of an integrated circuit embodiment 10 of a 1024-bit static nonvolatile, electrically-alterable random access memory (RAM) in accordance with the present invention. The device 10 is an integrated circuit having a plurality of memory locations, and I/O means for addressing the memory locations for inputting and outputting data. In this regard, the embodiment 10 comprises a memory array 12 having 32 rows and 32 columns of static, volatile addressable random access memory cells and associated nonvolatile memory cells. The device 10 further has row select circuit means 14 for activating conductive communication, with a selected row of the memory array 12 determined by the five digit binary number formed by inputs $A_0$, $A_1$, $A_2$, $A_3$, $A_4$, and column select circuit means 16 for activating conductive communication with a selected column of the memory array 12 determined by the five digit binary number formed by the column select inputs $A_5$, $A_6$, $A_7$, $A_8$ and $A_9$. Accordingly, inputs $A_0$-$A_9$ are memory address lines, which are input connections to the integrated circuit 10. The row select circuitry and column select circuitry may be of generally conventional design, and need not be further described. However, it should be noted that while the illustrated embodiment 10 has five row select and five column select address lines to form a 32×32 bit array, other memory sizes may readily be provided. Thus, for example a 128×128 bit (16,384 bit) array in accordance with the present invention may be provided utilizing a seven bit row select circuit architecture and a seven bit column select architecture, with 14 address lines $A_0$-$A_{13}$.

The integrated circuit 10 is further provided with means for inputting and outputting data, to and from, respectively, memory cells of the memory array 12 selected by means of the row and column select circuitry 14,16. In the illustrated embodiment 10, such I/O means take the form of column I/O circuitry 20 which functions in conjunction with column select circuitry 16, and may be similarly of conventional design. Data input terminal, or pin, $D_{in}$ provides binary input data to the column I/O circuitry 20, and output data terminal $D_{out}$ provide for output of data from the memory array 12 which is addressed by the row and column select circuitry.

The apparatus 10 further includes control logic means 22 which is provided with chip select, write enable, recall and store input signals. Data In ($D_{in}$), Data Out ($D_{out}$), Chip Select ($\overline{CS}$), and Write Enable ($\overline{WE}$) are conventional external I/O control signals for RAM circuits, and are associated with external device I/O pins. The signals Recall ($\overline{RCL}$) and STORE Input ($\overline{STO}$) control the interaction of the static random access memory and the nonvolatile electrically-alterable section of the device 10, as will be more fully described hereinafter. Recall ($\overline{RCL}$) is a signal which may be utilized to either cause a single, selected bit to be brought from the nonvolatile memory to the RAM section of the memory 12, or to cause the entire data content of the nonvolatile memory section of the memory 12 to appear in the RAM section of the memory. Further, both complete and selected bit recall may be made available on the same integrated circuit by simply adding an additional control line. The other two pin inputs to the device 10 are the ground pin GND (which provides internal ground voltage Vss), and the standard TTL chip power supply input voltage pin Vcc. It is important to note that all signals previously described are TTL level logic signals. These are the only input signals to the device 10, which does not require time-shaped high voltages and high currents on any of the control pins of the device 10. Specifically in this regard, the STORE Input ($\overline{STO}$) to the control logic means 22 is a control pin that causes the present contents of the volatile RAM portion of the memory array 12 to be stored in the nonvolatile portion of the memory array device 10. The STORE Input may be a low level, TTL input signal for initiating the altering of the contents of the nonvolatile memory. The logic truth table for the operation of control logic means in effecting operation of the device 10 is shown in detail in FIG. 2 in respect of high (H) or low (L) level pin input signals and device mode of operation. In addition to conventional RAM circuitry for carrying out the conventional write enable and chip select functions of RAM systems, the control logic circuitry 22 includes means for generating a high voltage pulse particularly adapted to transfer the static RAM memory contents to the nonvolatile memory, and means for testing the internal and external power supplies, as will be described in more detail hereinafter.

Figures 5, 14:
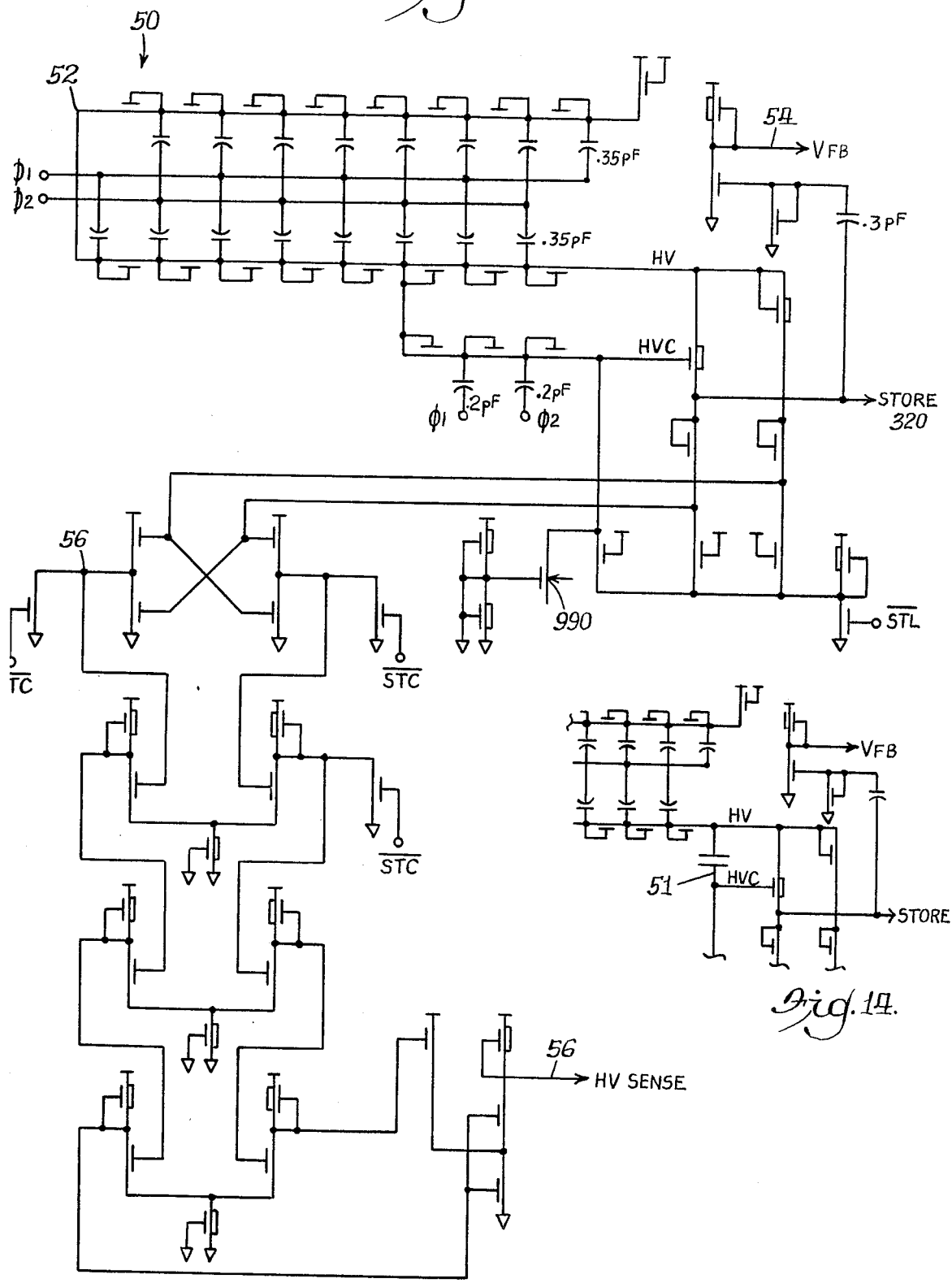
FIG. 5 is a circuit diagram of the high voltage generator circuitry for the nonvolatile memory elements of the memory array of FIG. 1.
FIG. 14 is a circuit diagram of another embodiment of a portion of the high voltage generator circuitry of FIG. 5.
Figure 6:
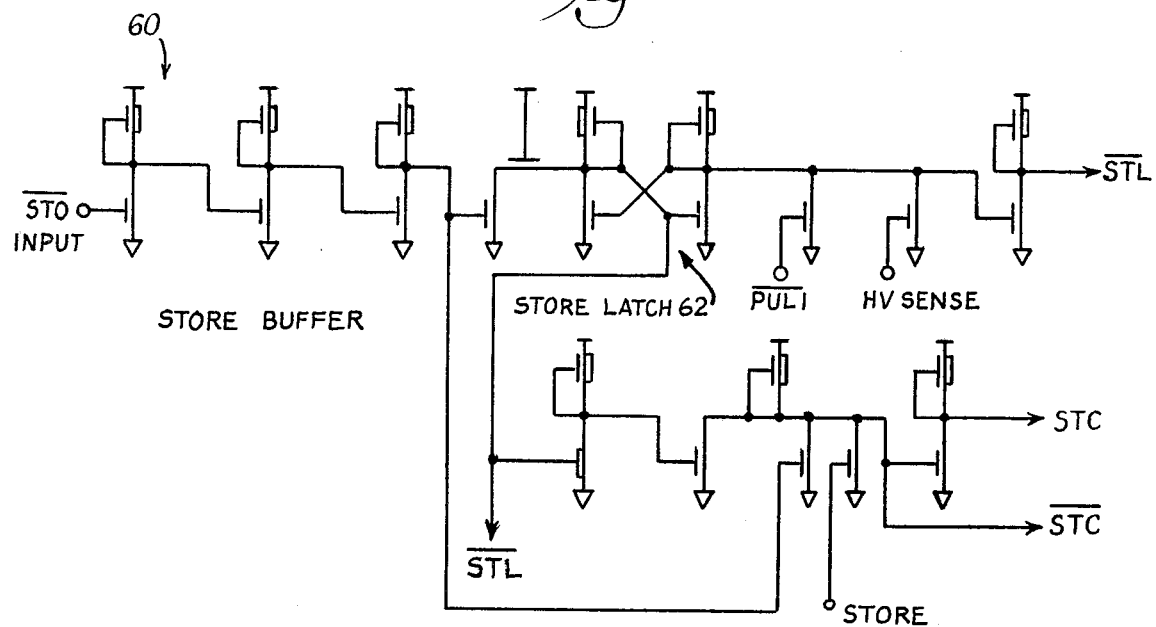
FIG. 6 is a circuit diagram of store control circuitry for controlling the high voltage generator circuitry of FIG. 5 in utilizing the nonvolatile memory elements of the memory array of FIG. 1.
Figure 8:
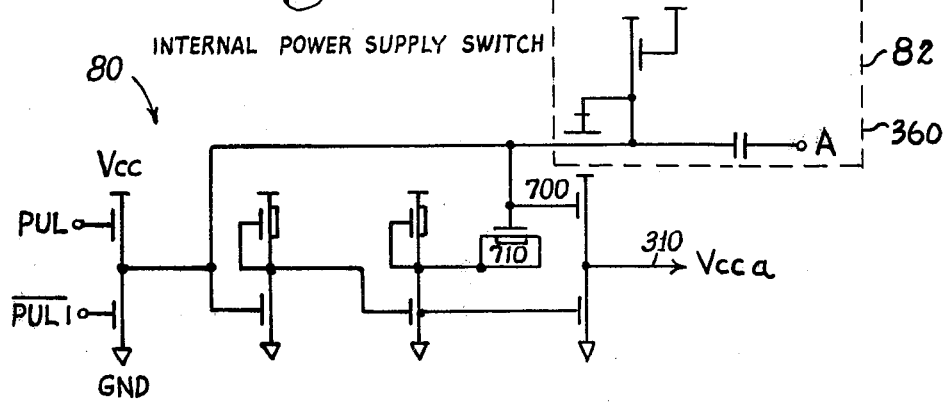
FIG. 8 is a circuit diagram of the internal power switch circuitry of the memory device of FIG. 1.
Figure 11:
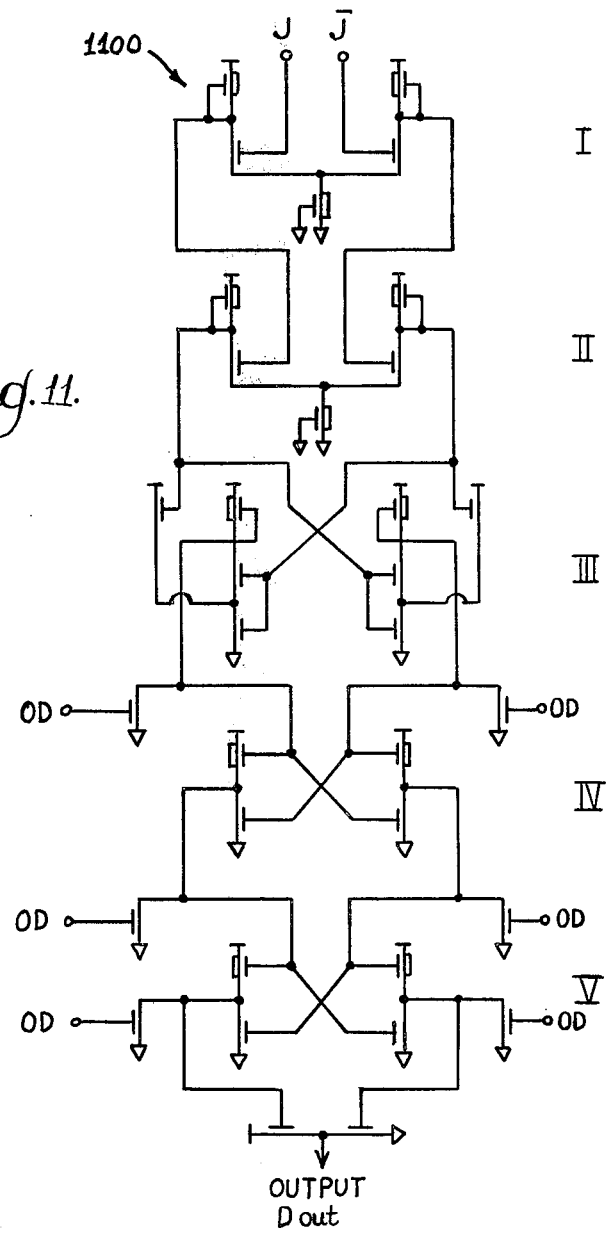
FIG. 11 is a circuit diagram of the output circuitry of the memory device of FIG. 1.
Figure 9:
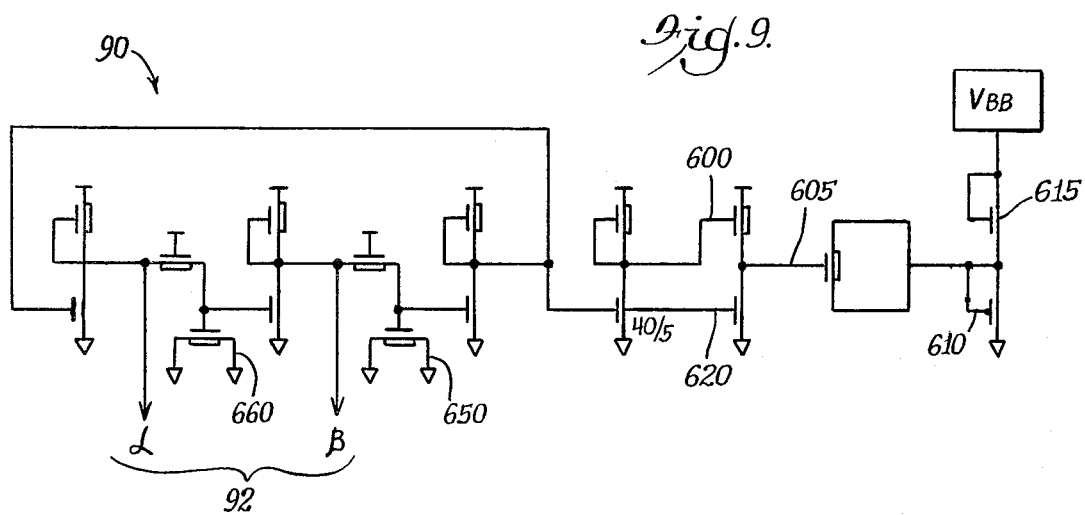
FIG. 9 is a circuit diagram of on-chip voltage bias generating circuitry of the memory device of FIG. 1.
Figure 10:
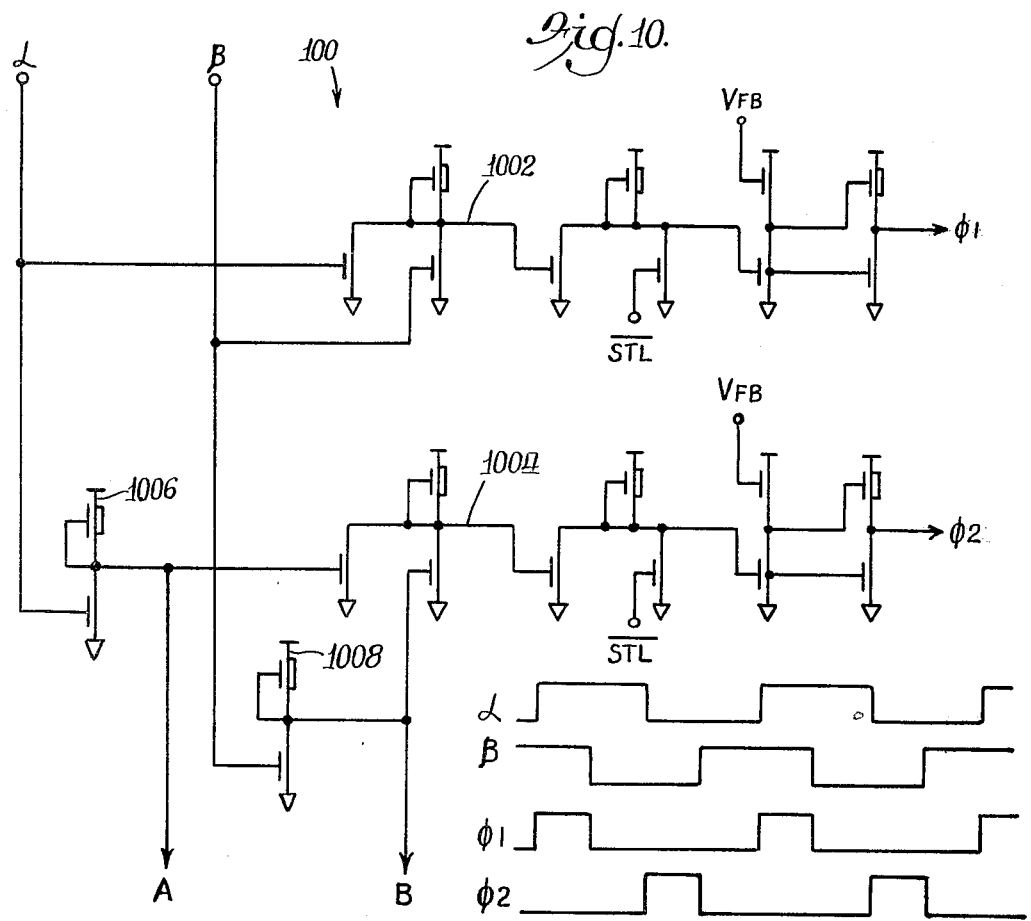
FIG. 10 is a circuit diagram of on-chip multiphase signal generating circuitry of the memory device of FIG. 1, together with an illustration of input and output signal waveforms of the circuitry.
Figure 12:
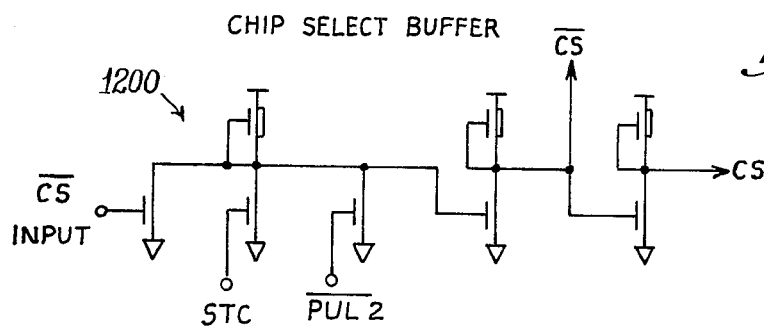
FIG. 12 is a circuit diagram of the chip select buffer circuitry of the memory device of FIG. 1, which is gated by the power supply sensing circuitry of FIG. 7.
Figure 13:
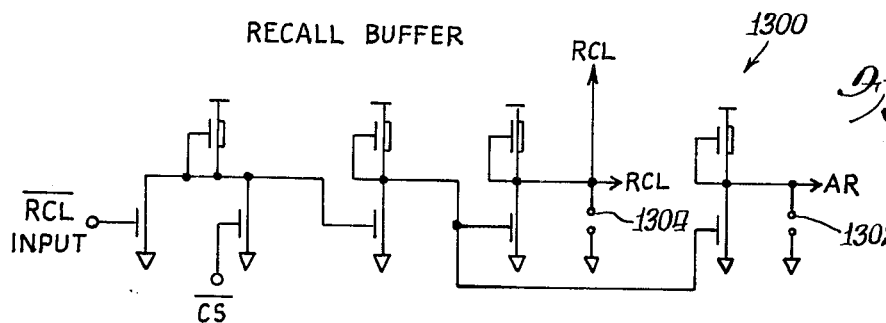
FIG. 13 is a circuit diagram of the recall buffer circuitry of the memory device of FIG. 1.
Figure 16:
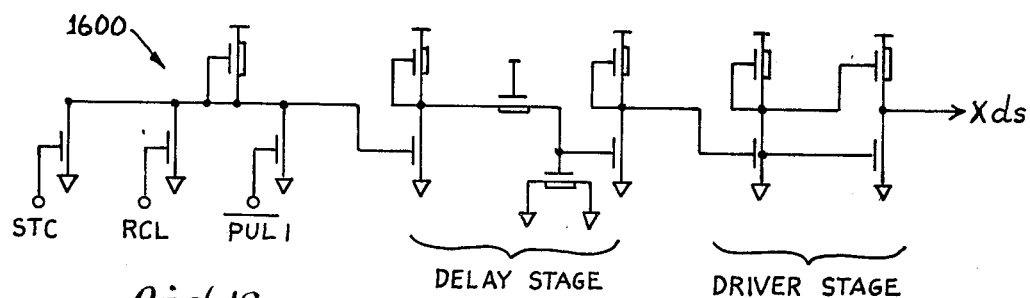
FIG. 16 is a circuit diagram of the X deselect generator for the memory circuit illustrated in FIG. 3.
Figure 17:
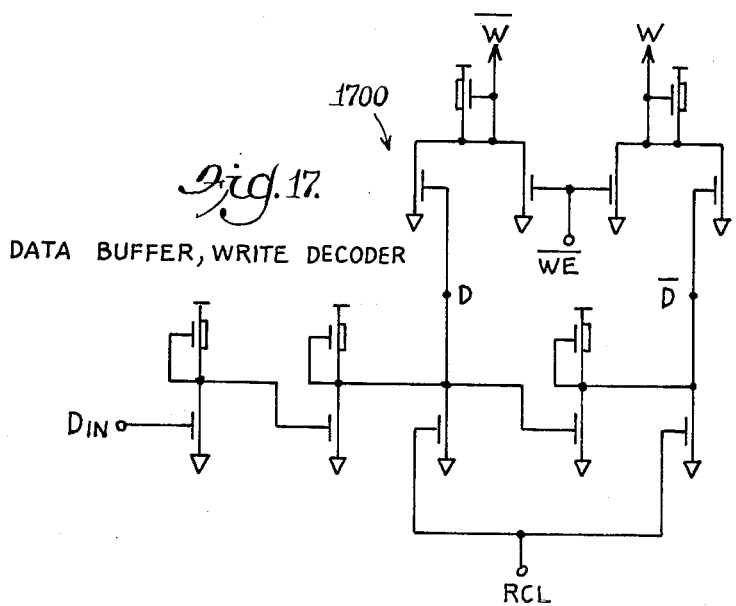
FIG. 17 is a circuit diagram of the data bufferwrite decoder of the memory device of FIG. 1.
Figure 15:
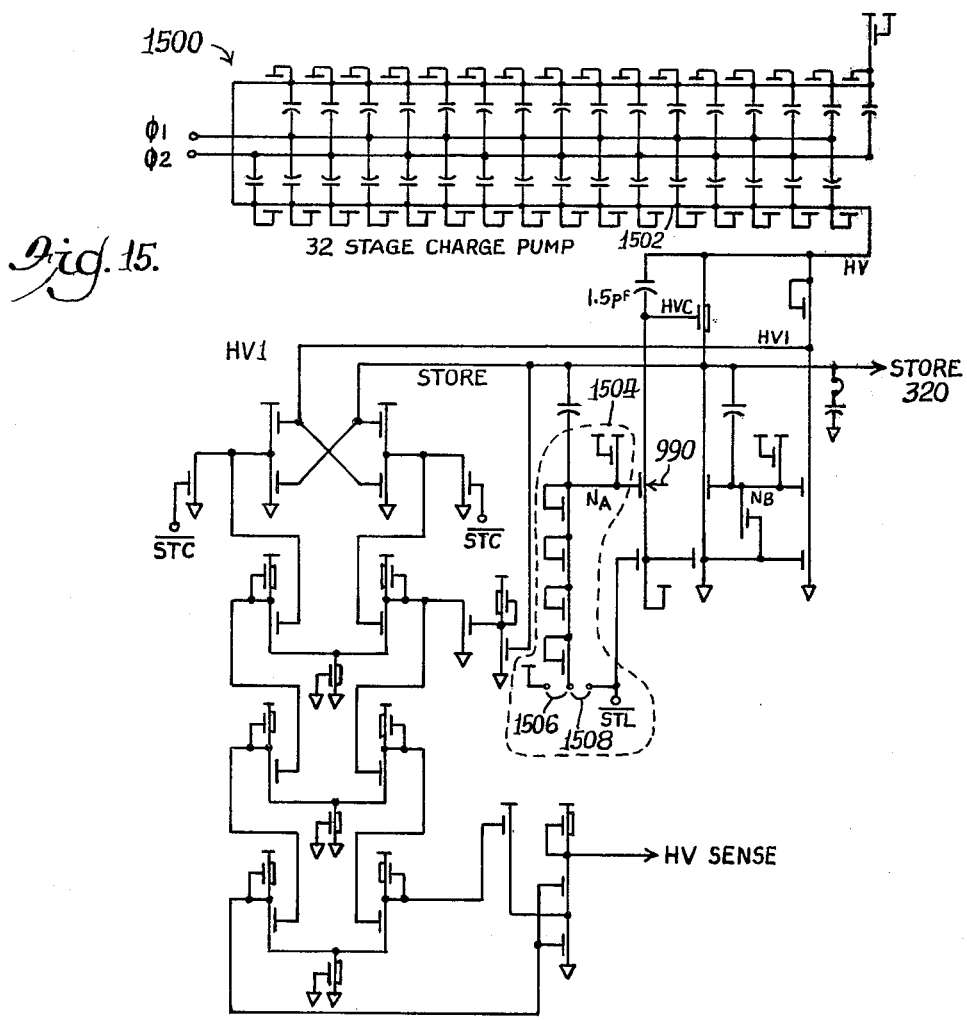
FIG. 15 is a circuit diagram of another embodiment of high voltage generator circuitry for the nonvolatile memory elements of the memory array of FIG. 1.

The detailed organization of the memory array aspects of the device 10, showing the cell configuration, decoding structure, placement of essential internal signals, and I/O circuits, is illustrated in FIG. 3. The Y Decoder, column transfer circuitry of the memory array of FIG. 3 is further shown in FIG. 20, while the X input buffer circuitry and the Y input buffer circuitry to the array 12, of the row and column I/O circuitry 14, 20, are respectively shown in FIGS. 21 and 22. Data output circuitry from the memory array is shown in FIG. 11, and data input circuitry from the array is shown in FIG. 17. Similarly, control and input circuitry of the control logic 22 is shown in various of these Figures. In this connection, the chip select buffer for the input signal $\overline{CS}$ is shown in FIG. 12, the recall buffer for the input signal $\overline{RCL}$ is shown in FIG. 13, the store input buffer for the input signal $\overline{STO}$ is shown in FIG. 6, the X deselect generator is shown in FIG. 16, the write enable buffer is shown in FIG. 18, and the output disable generator is shown in FIG. 19. The power supply circuitry 24, which is intimately associated with the control logic 22, is also shown in detail in various of the Figures. One embodiment of the high voltage generator of the power supply circuitry 24 is shown in FIG. 5 of the drawings, while more preferred embodiments of high voltage generator circuitry for the device 10 are shown in FIGS. 14 and 15. Back bias generator circuitry and circuitry for driving the high voltage generator are shown in FIGS. 9 and 10, respectively, while power supply sensing circuitry and internal power supply switch circuitry are similarly shown in FIGS. 7 and 8.

In the drawings, connection to ground potential Vss of the external GND pin is shown in triangular representation, and TTL low level operational input power provided directly or indirectly by the Vcc input terminal is shown in T representation, with the positive input potential being applied as the T. MOS enhancement and depletion devices are distinguished by the depletion devices having a rectangular representation opposite the device gate.

As illustrated in FIG. 3, the memory array of the device 10 is divided into a right plane 32 and a left plane 34, which are substantially bilaterally symmetrical, with the left plane being shown in more detail in the figure. The left and right planes each include sixteen "columns" of thirty-two compound memory cells. The row select circuitry 14 takes the form of conventional X address circuitry 36 for each of the X address lines operable upon application of address inputs $A_0$-$A_4$ to respecive inputs $X_0$-$X_4$, with $X_{ds}$ being an address signal for deselecting each of the X rows of the entire array.

Figure 21:
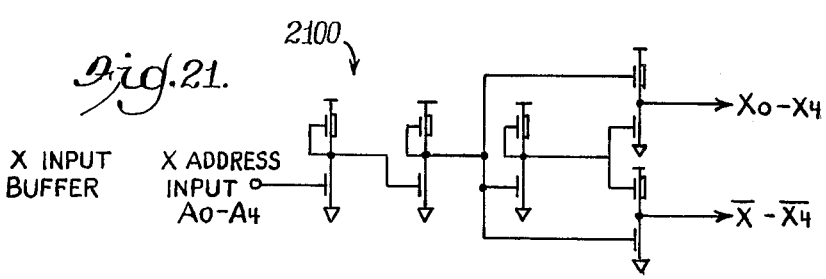
FIG. 21 is a circuit diagram of X input buffer circuitry for the memory circuit of FIG. 3.

X input buffer circuitry 2100 for reviewing and buffering one of the external address inputs $A_0$-$A_4$ and providing the corresponding internal input signals $X_0$-$X_4$, $\overline{X_0}$-$\overline{X_4}$ to the X address circuitry 36 is shown in FIG. 21. Each of the external address inputs $A_0$-$A_4$ is provided with a circuit 2100, for appropriate connection to the X address lines 370, as shown in FIG. 3.

Figure 22:
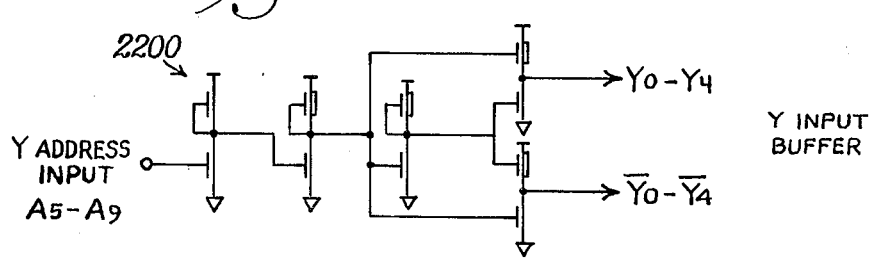
FIG. 22 is a circuit diagram of Y input buffer circuitry for the memory circuit of FIG. 3.

Similarly, the external Y address inputs $A_5$-$A_9$ are each directed through a respective Y input buffer circuit 2200 as shown in FIG. 22, which similarly buffers and conditions the external control signal, and provides the corresponding internal address input signals $Y_0$-$Y_4$, $\overline{Y_0}$-$\overline{Y_4}$ for the Y decoders. The column I/O circuitry 20 is embodied in left and right I/O bussess 38, 39, which respectively address the memory cells of the right and left memory planes 32, 34. The column select means 16 is embodied in a plurality of Y decoders, one for each column, operable upon application of address signals $Y_0$-$Y_4$ from respective external inputs $A_0$-$A_4$. The Y decoder 2000 (at the array end) is shown in FIG. 20, and comprises the gated column pullup devices 910, the column transfer device 960, an inverter 2002 for the gated column pullups, and 5-input NOR decoder drives of conventional design which drive about 0.36pF to 5 volts in about 40 nsec and draw about 55 microamps (1.8 ma total). During a write to the addressable volatile memory cell, or a "Bit Recall" (as will be more fully described hereinafter) of a selected nonvolatile data bit to the addressed volatile memory cell, the column transfer devices 960 present a series resistance of about 350 ohms from the column 330 to the I/O bus 38. The inverter 2000 gates the device 910 off when the columns are selected, to provide a low current and voltage level (typically less than 0.25 volts on both columns and less than 400 microamp current from the column pullups during bit recall function).

The memory array is separated by the central X decoder 36 into two planes containing 16×32 cells each. The X decoders 36 selects one row of 32 cells out of 32 rows by raising the cell transfer gates 950 to 5 volts, which couples the cells 40 to their respective columns. The array is similarly provided with a plurality of Y decoders 2000 which select one pair of columns out of the 32 pairs by raising the column transfer gates 960 to 5 volts, which couples the columns to their respective I/O lines. As previously indicated, the Y decoder 2000 also turns OFF the column pullup transistors 910 on the selected columns, except for smaller pullups 905 at the top of the array to minimize current. The I/O bus pullups 915 functionally replace the column pullups 910 since the columns are electrically coupled to the I/O bus through the column transfer gates 960. I/O bus transfers 912 are selected by internal control gates Y4 and $\overline{Y4}$, respectively, to couple the right or left I/O bus 38, 39 to the output buffer 1100 (FIG. 11). The power supply voltage in the array which is shown as Vcca 310 is turned on by a large pullup device in the Vcca switch circuitry 800 (FIG. 8) during memory data transfer from the nonvolatile memory to the RAM cells, as will be more fully described. Dual sets of write devices 902, 904 receive the write control signals W, $\overline{W}$ and are used, respectively, for the left and right I/O busses 38, 39 to reduce series resistance, particularly during bit recall data transfer function. The inverters of the devices 902, 904 gate off the I/O bus pullups on the busses which are to be pulled low, and these pullups serve as the column pullups for the selected columns (whose pullup devices were gated off by the Y decoder circuitry 2000) as well as write recovery devices. During a selected bit recall data transfer function, the devices 903 pull the I/O busses to less than 0.06 volts, which rises to about 0.25 volts by the time it gets to the columns because of the interconnect resistance (100 ohms) and previously referred to device resistance (350 ohms), which voltage is still below the 0.3 volt array ground potential of the memory array 12.

As indicated, and as shown in the upper left hand portion of FIG. 3, the memory array 12 of the device 10 comprises a plurality of compound memory cells 40 each including a volatile, addressable static RAM cell, and a nonvolatile memory cell associated therewith in data transfer relationship. Suitable compound, nonvolatile electrically-alterable static RAM cells are described in detail in copending application Ser. No. 6,029, filed Jan. 24, 1979, and entitled "Nonvolatile Static Random Access Memory Devices" which is incorporated herein by reference. A suitable nonvolatile RAM cell 40 is shown schematically in FIG. 4, and comprises two sections: a nonvolatile electrically-alterable section 42 ($E^2$PROM) and a static RAM section 44. The illustrated RAM section 44 comprises a conventional six-transistor static memory cell in the form of a cross-coupled flip-flop with two transfer gates, for substantially unlimited, directly addressable read/write cycles. The $E^2$PROM data is communicated to the RAM cell 44 by a controlled capacitive imbalance on the internal flip-flop nodes, N1 and N2, which causes a difference in the rise time on N1 and N2 during a recall or powerup cycle. The rise time difference causes the flip-flop to set in a preferred state.

The capacitive imbalance is controlled by the floating gate transistor, T1, which gates capacitor C1 ON or OFF of N1.

To "recall" $E^2$PROM data, RAM cell nodes N1 and N2 are brought to ground, balanced, then let go to rise at a rate determined by the depletion devices current and the capacitance of nodes N1 and N2. Typically, in the illustrated embodiment 10, the depletion current may be approximately 7 $\mu$A. Similarly, in the illustrated embodiment, the approximate capacitance on node N2 is about 0.1pF, while the capacitance on node N1 is about 0.05pF without capacitor C1, and about 0.15pF if capacitor C1 is gated onto node N1. Since either node N2 or N1 will rise faster in voltage depending on which has the smaller load, then the static RAM cell 44 will latch nodes N2 and N1 in complementary states (high and low voltage) determined by the relative voltage difference of N1 and N2.

The illustrated nonvolatile E$^2$PROM memory cell is capacitively coupled to the RAM cell 44, and is adapted to store data as a charge state on a dielectrically isolated, floating gate electrode 46. The illustrated nonvolatile cell 42 is of three polysilicon layer construction overlying the monocrystalline silicon chip substrate, and comprises a programming gate 48, the floating gate 46, a store/erase gate 50, and a pn junction isolated diffusion plate 52 in the chip silicon under the floating gate 46 which is controlled by a MOS device, transistor T2.

Erasing and programming of the E$^2$PROM cells 42 of the device 10 is accomplished by ramping the "store" lines 320 by applying thereto an internally generated voltage of about 20 to 40 volts in about one millisecond.

It should be noted that this internal signal STORE applied to store lines 320 of the memory array is generated on-chip upon application of the TTL level logic signal $\overline{STO}$ to the integrated circuit 10. The STORE pulse is specially shaped and tailored by an on-chip high voltage generator of the power supply and control circuitry 24, a detailed circuit schematic of which is shown in FIG. 5.

Transistor T2, the gate of which is connected directly to node N2 of the static RAM cell 44, determines whether the E$^2$PROM cell 42 is erased or programmed during a STORE cycle. In this regard, in programming of the E$^2$PROM cell 42, if node N2 is low (i.e., a binary zero), then the diffsion plate 52, which is capacitively coupled to store line 320, is allowed to float up, and carries along with it the floating gate 46 as the STORE pulse from the power supply means 24 ramps up the STORE/ERASE gate 50. The field from the programming gate 48 builds up to the point where electrons tunnel from the programming gate 48 to the floating gate 46, which raises the threshold of transistor T1. Because the cell 42 is capactively coupled to the RAM cell 44, the programmed, negatively charged floating gate may be "read" or copied to the RAM cell 44 as a binary zero. During such transfer, capacitor C1 is decoupled from node N1, which allows N1 to rise faster than node N2 such that a binary zero is read from the E$^2$PROM cell 42 by the RAM cell 44. As indicated, a binary zero is a low voltage (e.g., about zero volts) on node N2.

Similarly, the nonvolatile memory cell 42 may be "erased" to represent a binary "one". In this regard, when node N2 of the RAM cell is at a high TTL voltage (e.g., about +5 volts), representing a binary "one", then the large diffusion plate 52 is held at ground as the STORE pulse ramps up, which also capacitively couples the floating gate 46 to near ground due to strong capacitive coupling. When the field between the erase gate 50 and the floating gate 46 builds up enough, electrons tunnel from the floating gate to the erase/store gate 50 and the threshold of transistor T1 goes negative thereby becoming highly conductive, or strongly turned on, with respect to ground voltage provided to the device 10 via the GND pin input. In a similarly interactive manner of capacitive association between nonvolatile cell 42 and addressable static RAM cell 44, during recopying of the "erased" memory state of the cell 42 back to the cell 44, capacitor C1 is coupled to node N1, which allows N2 to rise faster than node N1, and sets the RAM flip-flop memory cell 44 in the opposite state from that previously described with respect to the recopying of negatively charged floating gate condition. Thus, a binary "1" is read from the E$^2$PROM and provides a relatively high voltage on node N2 compared to the corresponding value representing a binary zero.

Accordingly, it will be appreciated that binary data represented in the conductive configuration of the RAM cell 44 may be copied to the nonvolatile cell 44 as represented by a charge condition of the cell 42, and may subsequently be directly recopied to the cell 44 from the cell 42 to place the cell 42 in its original condition at the time the binary data was originally copied to the cell 42 from the cell 44. It is further noted that memory status of the cell 42 or 44 from which data is copied, or recopied, is not affected by the copying or recopying procedure.

The contents of the static RAM will appear on the column lines of the memory array as illustrated in FIGS. 1 and 3 after an x-select occurs, as is commonly accomplished in six-transistor static RAM cell design.

Although the data copying between nonvolatile cell 42 and volatile RAM cell 44 has been described with respect to a single memory cell 40 of the memory array 12, it will be appreciated that such data transfer functions may be carried out with respect to each of the cells 40 in the array. Thus, data may be input to the RAM portion of the memory 12, copied to the nonvolatile portion of the memory for substantially permanent nonvolatile storage, and copied back to the RAM portion for readout and utilization as desired. In the meantime, the RAM memory may be utilized as a conventional addressable RAM memory. However, when desired, the device 10 may be adapted to recall data either by copying the entire E$^2$PROM array to the static RAM or by copying a single selected bit from the E$^2$PROM into the corresponding static RAM memory cell. These various modes of operation may be determined by the means by which nodes N1 and N2 of the compound memory cells 40 are brought to ground in the cell. In this regard, the nodes N1 and N2 may be brought to ground in two ways. In a first mode of operation, the power supply Vcca to the memory array 12 (FIG. 3) is brought to ground potential, then turned back on quickly (compared to the rise times of nodes N1 and N2 of the memory cells 40 of the array 12) to recall the E$^2$PROM data in all compound cells 40 in the array 12. The capacitive imbalance between nodes N1 and N2 will then determine the state of the static RAM cell. When the integrated circuit 10 is powered up, it will always automatically execute such a complete data recall and thus have "known data" in the static RAM portion of the memory 12 which corresponds to the last written into the E$^2$PROM portion.

In a second mode of operation, the X and Y decoders may select one cell and both columns 330 adjacent either side of the selected cell (FIGS. 3, 4) may be brought to ground potential. The X decoder 370 then may be controlled to deselect this cell from its adjacent columns 330 by turning off MOS transistor devices 950 such that nodes N1 and N2 then rise at their proper rates to recall the E$^2$PROM data in that cell. In such mode of operation, accordingly, only a selected cell has data transferred from the nonvolatile to the volatile portion of the cell.

The Vcca power supply 310 and the X-Y decoding circuitry decoders are controlled by additional on-chip circuits which are generally well-known simple logic circuits and which accordingly need not be further described. However, some novel features associated with the Vcca power supply and control circuitry will be further described in respect of the cycle of the device 10.

As indicated, the device 10 comprises means for generating and controlling various power supplies, including a controlled relatively high voltage pulse for operation of the nonvolatile memory cells of the array 12. In this regard, the circuits 50, 100 illustrated in FIGS. 5 and 10 form a system for the generation and control of the high voltages utilized in the operation of the nonvolatile electrically-alterable memory cells 42. Such integrated circuits are described in concurrently executed and filed copending application entitled "Integrated Rise-Time Regulated Voltage Generator Systems", which is incorporated by reference herein.

The high voltage generator circuit formed by circuits 50, 100 of FIGS. 5, 10 provide means for generating a rise time regulated and level controlled high voltage pulse which can be readily realized as a portion of the integrated circuit 10. As shown in FIG. 5, the high voltage pulse is generated by a string 52 of diode connected stages driven by capacitively coupled low voltage clocks $\phi 1$, $\phi 2$. The maximum output voltage is set by a gated diode reference device 990 which provides a reference voltage independent of chip power supplied GND, Vcc. A feedback circuit 54 is provided which controls the high voltage rise time by modulating the effective low voltage clock amplitude which drives the high voltage generator. A logic level interface circuit 56 is also provided for sensing that the final high voltage level has been reached.

In the illustrated embodiment 10, the high voltage generator 50 is driven by nonoverlapping two phase clock signals $\phi 1$, $\phi 2$ which are provided by a two phase clock generator 100 illustrated in FIG. 10. The two phase clock generator 100 in turn is driven by the overlapping clock signals $\alpha$, $\beta$ provided by the back bias generator 90 of FIG. 9. The wave forms of the overlapping input signals $\alpha$, $\beta$ to the generator 100, and the nonoverlapping output signals $\phi 1$, $\phi 2$ are also generally shown in FIG. 10.

As indicated, the clock signals $\phi 1$, $\phi 2$ are utilized to drive a charge pump 52 of the generator 50 comprising a plurality of series-connected diode devices which are capacitively coupled to the $\phi 1$, $\phi 2$ signals to provide a relatively high-voltage output STORE signal 320. In the generator 50, a gated diode is used as a voltage reference source, a feedback circuit is utilized to control pulse rise times, and a high impedance means of detecting a reference high voltage is provided to detect the desired end of high voltage pulse conditions. A particular feature of the overall on-chip high voltage pulse generator circuit is that relatively long time constants (~1 msec) can be accommodated.

The importance of the high voltage generator circuit 50 is that it makes possible an overall integrated circuit which requires no external high voltage supply. Furthermore, when used as a supply in the nonvolatile E²PROM/RAM device 10, it provides a shaped and controlled STORE signal level 320. In addition, it allows a simple, noncritically timed TTL compatible logic signal to control nonvolatile memory operation.

As indicated, the illustrated high voltage generator circuit 50 comprises a 16-stage charge pump 52, driven by two nonoverlapping clocks $\phi 1$, $\phi 2$. The illustrated series-connected charge pump chain of FIG. 5 is split three stages from the end, and three small stages are used to generate a high voltage control signal HVC which for a given output impedance charges up ahead of the high voltage output signal HV at the output end of the chain 52, due to its small load, until it is clamped by a gated diode 990.

The charging rate of the charge pump 50 is proportional to the frequency (f), the effective Bootstrap ratio (e.g., 0.85) times $\phi 1$, $\phi 2$ voltage swing ($\Delta V$), and the ratio of the load capacitance on the output high voltage signal to the capacitance value of the pump capacitor.

It can be appreciated that relatively high voltages (25-50 V) can be practically generated from relatively low-voltage clocks $\phi 1$, $\phi 2$ (e.g., 5 V or less). Further, the use of simple nonoverlapping clock signals $\phi 1$ and $\phi 2$ provides a simple low-voltage means for controlling the charge pumping role and rise time of the high voltage generator 50. In this regard, the rise time of the output potential HV is sensed, and generates a control voltage $V_{FB}$ to the clock generator 100, which modulates the amplitude of the charge pump during signal $\phi 1$, $\phi 2$. The bifurcated split-chain charge pump design allows the generation of two high voltage signals, HV and HVC, which respond to different load conditions in order to determine desired output voltage conditions, other output voltage detecting circuitry may be provided. In this regard, illustrated in FIG. 14 is an alternative circuit design 51 which utilizes a predetermined capacitive load in place of the split chain charge pump design in the determination of desired output voltage.

Although the generator 50 could be used to drive both high and low impedance loads, the generator size is particularly small for high impedance capacitive type loads, and is particularly suited as a portion of the integrated circuit 10. As previously indicated, the device 10 includes various power supply sensing circuits for controlling memory operation. Data will be stored in the nonvolatile E²PROM any time the high voltage STORE signal 320 is generated internally. During powerup or powerdown of the device 10, or in the presence of changing power supply voltages, a condition may exist where the input control signals and the supply voltages are not of sufficient value to be unambiguously interpreted by the integrated circuit 10.

Ambiguous electrical conditions may occur when a device is beyond its normal operating voltages, such as when a device is first turned on, or powered-up or powered-down. In a conventional volatile memory device, such conditions occur when contents of the memory are in an undetermined state and must be initialized in the normal course of device operation. However, in the device 10 which has a capability for direct interaction between its nonvolatile memory component and its volatile random acess memory array component, it is desirable to prevent such interaction during the device powerup or power-down conditions to preclude storage of potentially invalid data. In this regard, the device 10 includes circuit means for preventing an accidental initiation of the STORE signal, to avoid an accidental storage of invalid data in the E²PROM section of memory with concommitant loss of the resident memory during power supply fluctuations or powerup or powerdown conditions.

Such circuit means comprises power supply sensing circuitry 24 including logic circuitry which functions to prevent storage of data in the nonvolatile E²PROM section of the device unless the external and internally generated power supplied provided are in acceptable, defined regions. The logic circuitry also provides signals which when combined with other circuit signals to be described later, function to automatically transfer the data in the nonvolatile E²PROM array to the static volatile RAM section on powerup or drop of power supplies beyond the acceptable defined region.

The power supply sensing circuit 24 thereby allows the integrated circuit 10 to be powered up or powered down in any arbitrary manner and still retain the nonvolatile E²PROM data and further re-initialize the static RAM upon each such cycle by automatically transferring the E²PROM data to the volatile RAM memory array of the device.

Figure 7:
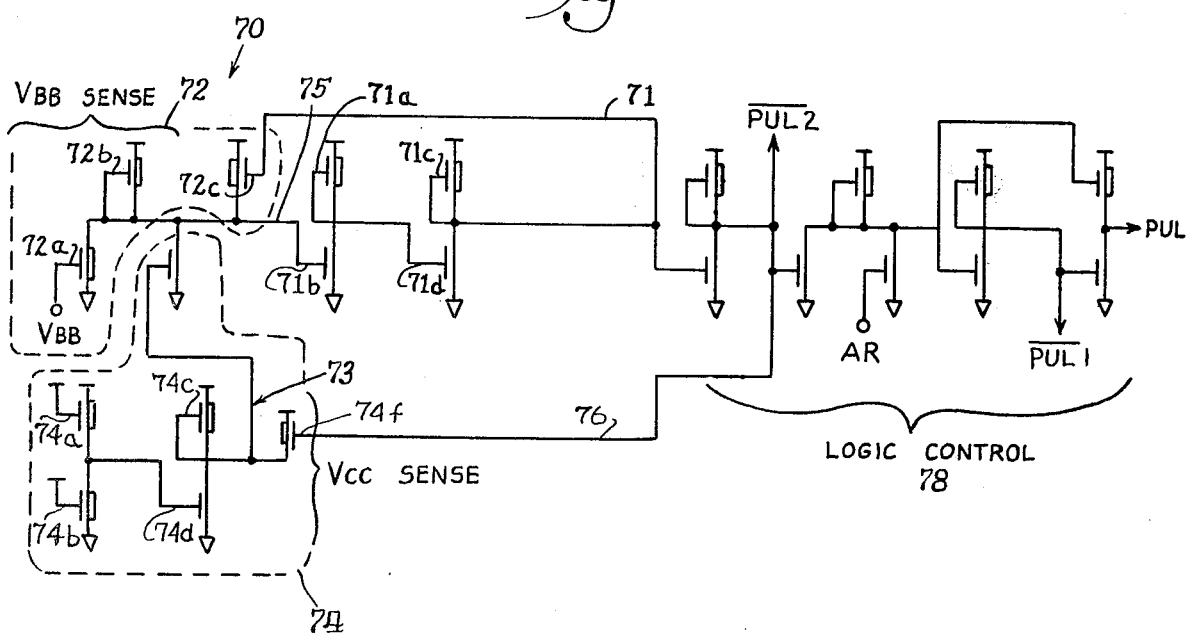
FIG. 7 is a circuit diagram of the power supply sensing circuitry of the memory device of FIG. 1.

A circuit schematic of a portion 70 of the power supply sensing circuit 24 with associated logic circuitry illustrated in FIG. 7 of the drawings. The circuit 70 comprises means 72 for sensing the internal back bias potential Vbb of the circuit 10, means 74 for sensing the external power supply Vcc provided to the circuit 10, and means 78 for generating logic control signals (PUL, $\overline{PUL1}$ and $\overline{PUL2}$) for control of the nonvolatile-to-volatile data transfer operation. The means 78 also receives a buffered Array Recall (AR) signal for initiating E²PROM to RAM memory data transfer.

In the operation of the circuit 70, when the proper voltage levels for circuit operation are met, the node 71 is high and causes the logic signals PUL, $\overline{PUL2}$ and $\overline{PUL1}$ to attain levels which cause the integrated circuit 10 to complete an automatic recall on powerup of the entire nonvolatile memory data to the volatile static RAM component of the circuit. However, when either of the internal Vbb or external Vcc power supplies are outside a predetermined range which is suitable for reliable device operation, the integrated circuit ignores all commands to execute a nonvolatile data storage cycle which would change the data in the nonvolatile E²PROM memory component.

Having generally described the circuit 70, its operation will now be described in more detail. As indicated, the external power supply Vcc is sensed by the five transistor network 74, having an output node 73. As illustrated, the circuit 74 includes four MOS depletion transistors having in the illustrated embodiment nominal width/length ratios of 6/13, 6/24, 10/6 and 6/20, and a 30/5 ratio enhancement transistor, the output node 73 of which gates the 35/5 enhancement transistor, and controls node 75. The indicated device parameters may be chosen to provide appropriate sensing of the input potential Vcc applied across the devices and ground potential as indicated. Node 75 is two inverter stages removed from node 71 which is the input of the logic control 78. Node 75 is also controlled by the Vbb sense network 72 which consists of two depletion transistors having length/width ratios of 7/5, 75/5, respectively. Although the power supply potential Vbb could be an external power supply, it can also be an internally generated supply as in the illustrated embodiment 10. In this case, it is specifically a supply of opposite polarity of Vcc generated on chip by circuit 90 of FIG. 9, and is commonly known as the back bias supply. On chip generation of the back bias supply removes the need for an external supply. Whether generated on chip, or provided by an external supply, the potential Vbb is applied to the circuit 72 for sensing thereof. Node 75 is accordingly thereby controlled by both power supplies Vbb and Vcc in the NOR gate configuration there shown. The circuit components may be selected to provide desired potential sensing ranges. By way of example, sizes of illustrated transistors are given such that the logic control input 71 is set when conditions of both Vcc are greater than about 3.5 volts and Vbb is less than about 31 1.5 volts are met.

As indicated, logic control input 71 is set when both the conditions of Vcc being greater than 3.5 volts and Vbb being less than −1.5 volts are met. When Vbb goes below −1.5 volts, the depletion pull-down transistor 72a (75/5) of the Vbb sense circuit 72 and the adjacent depletion transistor 72b (7/5) pulls up to the 1.5 volt switching point to the next stage [parenthetical ratios represent examples of device width to length ratios, in microns]. However, it should be recognized that although specific device parameters may be given, other ranges of dimensions and voltage control ranges may be used, such as typical of 5-volt MOS manufacturing procedures utilizing an oxide thickness in the range of from 400 to 1000 Angstroms. Similarly, the series depletion devices 74a (6/13) and 74b (6/24) of the Vcc sense circuit 74 require a condition of Vcc greater than 3.5 volts to exceed the 1.6 volt switching point of the inverter of the Vcc sense circuit 74 formed by transistors 74c (10/6) and 74d (30/5). When Vbb is less than −1.5 volts and Vcc is greater than 3.5 volts, node 75 is high, causing node 71 to be high via two inverter stages formed by devices 71a (10/6), 71b (30/5), 71c (10/6) and 71d (30/5) and thereby setting the logic control 78 which initiates an automatic "ARRAY recall" transfer of the entire memory content of the nonvolatile memory to the corresponding static RAM components of the device 10, followed by normal operation of the memory device as long as the proper voltage of Vbb, Vcc are maintained.

To assure clean operation even with relatively slow rise times of the applied potentials Vbb and Vcc, and to assure substantial noise immunity, hysteresis is provided to both the Vbb and Vcc sense circuits 72, 74. In this regard, when node 71 of the sense circuit 70 goes high, transistor 72c (6/10) of the illustrated Vbb sense circuit 72 shifts the switching point from −1.5 volts to −1.2 volts. Similarly, transistor 74e (6/20) of Vcc sense circuit 74, which interacts with devices 74c (30/5), 74d (10/6) and 74f (35/5), and which is driven by node 76, shifts the upper switching point from 1.4 to 2.2 volts. This hysteresis prevents multiple on/off cycling of the sense circuitry as the system potentials Vcc and Vbb rise slowly through the sensing points of circuit 70.

The illustrated logic control 78 also works in reverse such that if the potential of Vcc goes below about 2.8 volts, the logic control input 71 is reset, which activates an automatic "ARRAY recall" transfer of nonvolatile memory content to volatile RAM memory when the potential Vcc rises again, and prevents an accidental or inadvertently attempted transfer of data from the volatile static RAM section to the nonvolatile memory section of the memory device 12. In this connection, the logic output signals PUL, $\overline{PUL1}$, $\overline{PUL2}$ of the power supply sense circuit 70 are variously provided as direct or indirect input control signals to the control logic circuitry (FIG. 1) comprising chip select buffer 1200 (FIG. 12), recall buffer 1300 (FIG. 13), powerup store control circuitry 60 (FIG. 6), and internal power supply switch 80 (FIG. 8).

In this regard, before the logic control input 71 is set, the logic level output control signal $\overline{PUL2}$ of the illustrated logic control circuit 78 is in a high logic condition. The high logic condition of the logic signal $\overline{PUL2}$ is applied as one input signal to the chip select buffer circuit 1200 (FIG. 12) which forms a part of the control logic circuitry 22 (FIG. 1) of the memory device 10. Another input signal to the chip select buffer 1200 is the external chip select signal $\overline{CS}$ which is applied from an external terminal of the device 10. Application of the high $\overline{PUL2}$ logic signal from the logic control subcircuit 78 of power supply sensing circuit to the chip select logic buffer 1200 disables the control of the $\overline{CS}$ input signal. In the case of the potential Vcc being too low or the potential Vbb being too high, an external $\overline{RCL}$ signal applied to the device 10 will accordingly have no effect, because the internal $\overline{CS}$ signal input to recall buffer 1300 will be high, disabling the recall buffer 1300.

Provided the internal and external power supplies Vbb, Vcc are in operable ranges, the operation of the device 10 is controlled by external signal to the control logic circuitry (FIG. 1), and the function of the illustrated device 10 is in accordance with the truth table set forth in FIG. 2. The input signals comprise the conventional input data signal Din, the chip select signal $\overline{CS}$, and the write enable signal $\overline{WE}$ of a RAM memory, together with the recall signal $\overline{RCL}$ and the store signal $\overline{STO}$ which initiate recall and store data transfer between the volatile and nonvolatile sections of the memory array 12.

The data input signal Din is supplied to the device 10 via data buffer, write decoder circuit 1700, which uses a typical TTL input stage. The data buffer 1700 also is provided with internal control signals $\overline{WE}$ from $\overline{WE}$ buffer 1800, and $\overline{RCL}$ from recall buffer 1300.

The buffered input data signals D, $\overline{D}$ connect directly to a write decoder to provide signals $\overline{W}$, W, which are also controlled by internal write enable signal $\overline{WE}$. The internal write enable signal $\overline{WE}$ must be low, which occurs during write command or bit recall command, to enable the write decoder signals W or $\overline{W}$, to go high. During a bit recall cycle of nonvolatile to volatile data transfer (RCL=high) both D and $\overline{D}$ are pulled low and both W and $\overline{W}$ go high to write zeros on both addressed columns.

The external write enable signal $\overline{WE}$ is similarly applied to a $\overline{WE}$ buffer 1800 (FIG. 18), which uses a standard TTL compatible input stage and write cycle of the volatile memory section. Likewise, the external chip select signal $\overline{CS}$ is applied to chip select buffer 1200 to generate internal CS, $\overline{CS}$ control signals. If the "chip" 10 is selected ($\overline{CS}$=low) and the $\overline{WE}$ input is low, the buffered output signal $\overline{WE}$ of circuit 1800 enables the write decoder, and buffered output WE to activate the output disable generator 1900 (FIG. 19) to trestate the output. The RCL signal from the recall buffer 1300 is normally low. However, during a recall cycle, $\overline{WE}$ is pulled low and WE goes high to write zeros on both addressed columns and to Threestate the device output. In addition to the typical RAM chip select and write enable functions, the control logic of the device 10 functions to control transfer of data from nonvolatile to volatile memory upon external $\overline{RCL}$ command. The external $\overline{RCL}$ signal is applied to the recall buffer 1300, which generates either a logic output signal AR, or a logic output signal RCL, depending on the mask option used in manufacture of the buffer 1300. The logic output signals AR and RCL are internal logic signals which respectively, cause transfer of all of the data from the nonvolatile memory to the static RAM memory (Array Recall operation), or transfer of one selected (addressed by $A_0$–$A_9$ inputs) bit of data to a selected addressed RAM memory cell from its associated nonvolatile memory cell (Bit Recall operation). Further, in this regard, before the logic control input 71 is set, the logic output signal $\overline{PUL1}$ is high which, when applied to the power up logic control circuit 60, resets the store latch 62 of the circuit 60 (to guarantee the chip 10 does not come up in the STORE mode), deselects the X select lines of the memory array 12 via the X deselect generator 1600 (FIG. 16), and turns off the Vcca internal power supply switch 80 (FIG. 8).

When, upon obtaining appropriate Vcc and Vbb power levels, the logic control 71 of the power sense circuit 70 (FIG. 7) is set, output signals $\overline{PUL2}$ and $\overline{PUL1}$ go low, activating the device 10. Output signal PUL similarly goes high, activating the Vcca switch 80 (FIG. 8). The signals PUL, $\overline{PUL1}$, $\overline{PUL2}$ can now be used with other logical signals to control or lock out various signals until proper voltages are present, as will be apparent from the drawings.

In this regard, chip select buffer 1200 illustrated in FIG. 12 receives the $\overline{PUL2}$ input signal, and its operation illustrates some of the features of the integrated circuit 10 and how the power supply sensing circuit 70 output can be used.

As indicated, during powerup, output logic signal $\overline{PUL2}$ of circuit 70 is high until a potential greater than 3.5 volts on the power supply Vcc and a back bias potential Vbb of less than −1.5 volts are both reached. Further, in this regard, the chip select buffer 1200 receives as logic input signals the external $\overline{CS}$ signal, the STC store signal from store logic circuit 60 FIG. 6) and the $\overline{PUL2}$ signal generated by power supply sense circuit 70 (FIG. 7). The chip select buffer 1200 outputs internal chip select signals CS and $\overline{CS}$ which control actual chip selection. The chip is accordingly automatically deselected by the chip select buffer 1200 during powerup or powerdown, by means of the high $\overline{PUL2}$ signal, as will be seen from examination of the chip select buffer circuit 1200. Similarly, during a STORE cycle, the control signal STC from circuit 60 (FIG. 6) is also high, which also completely deselects the chip or device 10.

As indicated, the "deselection" of the device 10 is carried out under the control of the internal control signals CS and $\overline{CS}$ generated by the chip select buffer 1200. In this regard, the internal chip select control signal $\overline{CS}$ generated by the chip select buffer 1200 in turn forms an input signal to recall buffer 1300, as does external input recall signal $\overline{RCL}$. When the chip is deselected, the $\overline{CS}$ (high) signal locks out the $\overline{WE}$ buffer 1800 (FIG. 18) and recall buffer 1300 (FIG. 13) and activates the output disable generator 1900 (FIG. 19) to trestate (i.e., put in high impedance mode) the output circuit 1100 (FIG. 11). The other internal chip select internal control signal CS generated by the chip select buffer 1200, is similarly used to control chip selection. In this regard, internal signal CS (low), through connection to various internal buffers, prevents the initiation of a STORE cycle, while CS (high) permits initiation of a STORE cycle.

In FIG. 13 is shown the recall buffer 1300 and indicates how an array recall function or bit recall function would operate.

As previously indicated, the external $\overline{RCL}$ logic signal (FIG. 1) may be used to cause either an array recall transfer of all nonvolatile data to the static RAM memory, or a bit recall transfer of a nonvolatile data bit to a selected RAM cell. When only one external $\overline{RCL}$ input signal is utilized, the device 10 may be readily manufactured to accomplish a selected type of transfer. Depending on a simple metal mask option, as shown at numerals 1302, 1304, with the nonselected option being short-circuited to ground potential as shown. The recall buffer 1300 accordingly may serve to generate either an internal bit recall input control signal (RCL) or an internal array recall input control signal (AR). However, it is also possible to provide both features by simply adding two separate external control signals (e.g., an external control pin for a bit recall signal $\overline{BRCL}$ and an external control pin for an array recall signal $\overline{ARCL}$) and providing appropriate dual internal logic circuits like those of FIG. 13 for each of the respective external control pins.

If the chip 10 is selected (i.e., by external input $\overline{CS}$=low and $\overline{RCL}$=low) the output signal of circuit 1300 is either RCL=high for initiating a bit recall data transfer or AR=high for initiating an array recall data transfer. A metal jumper to ground blocks the unused function of mask option 1302 or 1304.

As indicated, AR and RCL are the internal control signals generated by recall buffer 1300. When it is desired to carry out a bit recall data transfer function utilizing a device 10 having a recall buffer 1300 including an operable internal RCL circuit element selected by mask option, the internal bit recall RCL signal of circuit 1300 is utilized as an input signal to data buffer 1700 (FIG. 17) to cause the internal data signals $D=\overline{D}$=zero, and $\overline{WE}$ buffer 1800 (FIG. 18) to "write" a ($W=\overline{W}=1$) on both columns (e.g., columns 330 of cell 40 of FIG. 4) on either side of a selected memory cell, when the applied internal control signal RCL=high. The X deselect generator 1600 (FIG. 16) is then triggered to generate appropriate internal X deselect control signal $X_{ds}$ to deselect the word lines of the RAM memory array (FIG. 3) after about 70 nsec, which disconnects all cells 40 from the column lines 330. In this manner, data is transferred (recalled) to a selected RAM memory cell from its associated nonvolatile memory cell.

When it is desired to carry out an array recall data transfer function utilizing a device 10 having a recall buffer 1300 including an operable internal AR logic signal generating circuit (by appropriate mask option) as previously described, an external $\overline{RCL}$ signal (low) is applied to the recall buffer 1300. The internal AR logic signal provided thereby is applied as a logic input control signal to the power sense circuit 70 as shown in FIG. 7 to turn off the internal array power supply Vcca (FIG. 8), to block initiation of a STORE, to threestate the output of output circuitry 1100 (FIG. 11) via output disable generator 1900 (FIG. 19) and to trigger the X deselect generator 1600 (FIG. 16). After about 100 nsec, the entire memory array 12 of the illustrated embodiment 10 is at ground potential and the external control signal $\overline{RCL}$ can go high, causing potential Vcca to rise and an array recall data transfer of all of the nonvolatile memory section data to the corresponding RAM memory cells to be carried out. Further in this regard, the power supply sensing circuit 70 (FIG. 7) generates internal logic signals PUL and $\overline{PUL1}$ which are responsive to the internal array recall control signal AR and which in turn drives the Vcca array power supply switch circuit 80 (FIG. 8). Controlling the power supply Vcca to the memory array 12 is the method of ensuring that the nonvolatile E²PROM data is properly copied into the volatile static RAM memory section of the device 10 upon powerup cycle, and array recall data transfer cycles.

Figure 4:
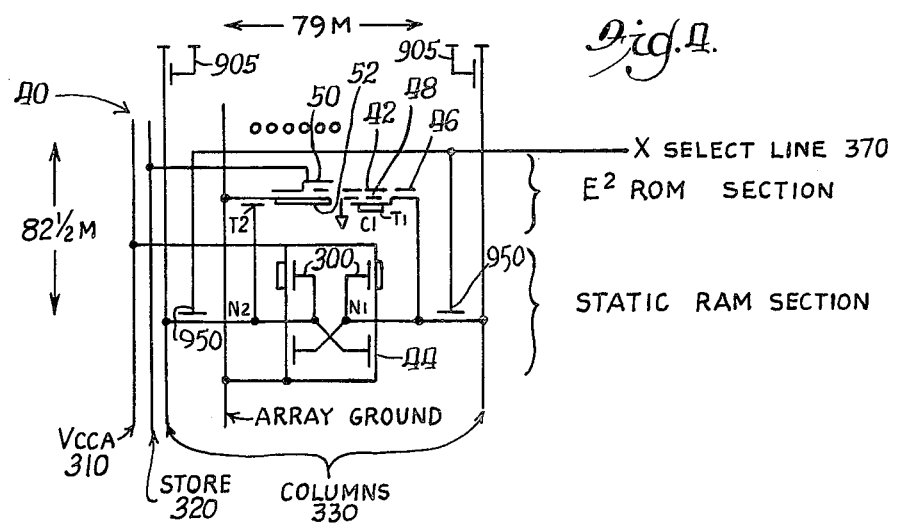
FIG. 4 is an illustration of one of the nonvolatile static random access memory cells of the random access memory array of FIG. 1.

The illustrated Vcca switch circuit 80 is designed to pull the entire memory array 12 above about 2 volts in less than about 30 nsec, with an external power supply potential Vcc equal to 3.5 volts and a back bias potential Vbb equal to −1.5 volts. The potential Vcca provided by switch circuit 80 should rise faster than both node N1 and node N2 in the array cells 40 (FIG. 4) in order to most reliably ensure proper recall of the data from the nonvolatile E²PROM section to the volatile RAM section of the memory array 12 of the device 10. This rise time is achieved in the illustrated embodiment 80 by bootstrapping the gate of device 700 via a bootstrap capacitor 710. A further feature of this switch 80 is subcircuit 82 which is a small charge pump circuit driven by a periodic signal waveform such as signal A from generator 100 (FIG. 10), to maintain a relatively high voltage on the gate 700 even after the dynamic bootstrap action diminishes, such as when the typical junction leakage occurs. The net result is that the circuit 80 appears to be substantially purely static in operation rather than dynamic, which is significant in providing the desired relatively rapid rise time with respect to the nodes N1 and N2 of the memory cells 40 (FIG. 4).

As previously indicated, an internal power supply for providing a negative bias potential Vbb is provided in the device 10, although said power could also be provided as an external power supply. The potential Vbb is applied to the semiconductor (silicon) substrate as a back bias potential in accordance with conventional practice. The Vbb generator 90 of the device 10 is illustrated in FIG. 9, and comprises a 3-stage ring oscillator 92, a large charge pump capacitor 605, and two diode connected drives to establish one-way charge transfer of electrons to the substrate of the integrated circuit device 10. Two delay elements 660, 650 each having a delay of about 100 nsec are used to set the ring oscillator 92 oscillation frequency of the illustrated device 90 at about 5 MHz. A driven pullup stage 600 charges the top plate of the capacitor 605 to a potential of about 5 volts while the "diode" connected device 610 clamps the source/drain diffusions of the circuit to about 1 volt. When output device 620 pulls the top plate of the capacitor 605 to ground potential the source/drain diffusions are driven towards −4 volts. If the Vbb output potential is greater than −3 volts, the top illustrated diode device 615 intermediate the integrated circuit substrate and the back bias generator 90 turns on and allows electrons to flow into the substrate to thereby maintain Vbb at a negative voltage.

The illustrated back bias generator typically pumps the silicon substrate to a potential of about −3 volts and draws a current of about 0.5 mA. The (5 MHz) oscillation characteristic of the three-stage ring oscillator 92 of the back bias generator 90 is also used in the circuit 10 for function other than driving the back bias voltage generation of the Vbb potential. The illustrated ring oscillator circuit 92 is provided with output lines originating from points respectively intermediate the three oscillator stages which correspondingly provides two phase overlapping clock signals α and β at the frequency of the oscillator 92. The two phase overlapping clock signals α and β are applied as input clock signals to the nonoverlapping clock generator circuit 100 shown in FIG. 10 which provides the nonoverlapping clock signals φ1 and φ2 utilized by the high voltage pulse generating circuit 50 (FIGS. 5, 14 and 15) for generating the high voltage STORE pulse utilized for transferring data from the volatile RAM memory section into the nonvolatile E²PROM memory section associated therewith.

The φ1, φ2 generator 100 uses the α and β signals from the Vbb generator 90 to generate nonoverlapping φ1, φ2 clocks for the high voltage generator 50 with phase relationship generally as shown graphically by FIG. 10.

The driver 100 comprises two substantially identical subcircuits 1002, 1004 for respectively providing the φ1 and φ2 nonoverlapping clock signals, and two inverters 1006, 1008 for generating inverted α and β signals A and B, respectively. The signal A is used, as previously indicated, to drive charge pump subcircuit 82 of Vcca switch 80 (FIG. 8). The B signal there illustrated is not used in the particular device 10 of FIG. 1, but may be used in place of the A signal, or in additional circuitry, where appropriate. During a store cycle for writing of RAM data to the nonvolatile E²PROM memory, the φ1 and φ2 driver circuits 1002, 1004 each drive an impedance load of about 3.5 pF. The total voltage swing of the φ1, φ2 signals is controlled by the feedback potential signal Vfb from the HV feedback subcircuit of the high voltage generator 50 as illustrated in FIG. 5. The operation of the generator 50 is more specifically described in our copending application entitled "Integrated Rise-Time Regulated Voltage Generator Systems" Ser. No. 71,498, which is contemporaneously executed and filed herewith and which is incorporated herein by reference.

The high voltage generator 50 is responsive to the external $\overline{STO}$ input signal, and it is this external signal which is utilized to initiate the STORE cycle of the device 10. The external $\overline{STO}$ input signal is applied to STORE buffer circuit 60, which also receives $\overline{PUL1}$, and STORE HV sense input signals for generating internal control signals $\overline{STL}$, STC, $\overline{STC}$ for controlling the high voltage generator circuitry 50 (or 1400 or 1500).

A particularly preferred embodiment of the high voltage generator charge pump circuitry is shown in FIG. 15, which is similar to the circuitry 50 of FIG. 5, but which includes thirty-two charge pump stages 1502, a capacitive voltage sense circuit arrangement like that of of FIG. 14, and means 1504 for controlling the voltage of the node Na of gated diode clamp 990. The means 1504 is a ratioed inverter circuit which provides for "tuning" of the voltage of node Na of the gated diode clamp 990, which accordingly controls the voltage at which the diode 990 clamps, and therefore the output voltage of the high voltage STORE pulse 320. One end of the inverter circuit 1504 has mask options 1506, 1508 which shift the clamp voltage. The clamp voltage of mask option 1506 is about 31 volts, while the clamp voltage of option 1508 is about 38 volts. In manufacture, one of the options 1506, 1508 will be selected to provide the most desired output voltage for the particular device being manufactured.

As previously indicated, the device output means including the column I/O circuitry includes means for providing three output states for the device 10. This is accomplished in the illustrated embodiment by means of an output buffer circuit 1100 as illustrated in FIG. 11. The illustrated output buffer 1100 provides means for putting the device output at either ground potential, at the potential of the external power supply Vcc or a high impedance state. The output buffer accordingly supplies three states. The illustrated output buffer 1100 goes to the high impedance state when the signal OD (output disable) from output disable generator 1900 (FIG. 19) goes high. The signals J, $\overline{J}$ from the column I/O circuitry 20 (FIGS. 1, 3) are applied as input signals to the output buffer 1100. The illustrated output buffer 1100 is a five stage output buffer circuit, as shown in the drawing, and the data input signals J, $\overline{J}$ are applied to stage I of the buffer 1100. The J/$\overline{J}$ crossover point occurs typically at 3.5 volts about 100 nsec after an X address transition in the operation of the device 10 (FIG. 3).

Stage I and Stage II of the device 10 are differential stages which provide a typical small signal gain of about 6 at each stage, and level shift down of about 0.25 volts at each stage.

Stage III of the output buffer 1100 primarily level shifts the low side from 2.0 volts to 0.25 volts typically and boosts the high side from 3.5 volts to 4.9 volts. Stages IV and V of the output buffer are "driven" depletion stages with power ramping up to provide good drive for the large output devices.

The data output signal Dout is provided at the output of Stage V of the output circuit 1100, and may be provided to a data output pin or terminal of the integrated circuit 10.

Accordingly, it will be appreciated that an integrated addressable RAM memory system has been provided which upon appropriate command is capable of reliably and permanently storing volatile random access memory data into a nonvolatile memory array without an external high voltage power source. The nonvolatile stored memory content of the system is automatically and reliably copied into the volatile random access memory upon powerup of the device, or upon appropriate external command.

The nonvolatile electrically erasable/programmable system has been illustrated with reference to a particular embodiment of a 1024-bit E²PROM static RAM device 10, by way of example, various modifications, adaptations and alterations of the system will be apparent based on the present disclosure. For example, devices of large capacity in terms of numbers of bits may readily be provided by extending the size of the memory array. Further, while the illustrated device is particularly adapted to be manufactured in n-channel MOS design configurations using a silicon substrate and nominal 5 micron minimum design rule parameters, other design configurations may be utilized in realization of operable devices incorporating various of the aspects of the present invention. For example, it is also possible to produce devices using many of the well-known semiconductor processes such as p-channel SOS (silicon on sapphire or spinel) manufacturing and design parameters. Further, while the illustrated embodiment has a single bit address or organization, it is also clear that the input/output signals of the device may readily be organized in a word orientation (e.g., 4 or 8 bits wide) as opposed to single I/O structure. A single addressable word recall data transfer function for transferring to an addressed word the nonvolatile data from the corresponding nonvolatile memory cells may readily be provided in lieu of, or in addition to the bit recall data transfer function. Further, while the illustrated device 10 is an integrated circuit memory chip, other integrated circuits in accordance with the invention may also have uses as a subsection of other integrated circuits. Of particular use would be as a portion of microcomputer circuit and as a means of implementing fault-tolerant memory devices. Used as a portion of an integrated microcomputer circuit, the nonvolatile RAM presents a novel component which could be used in new ways or augment existing devices. An interesting usage with integrated microcomputer circuitry encompasses storage of system status during powerdown to allow resumption of work on powerup, and storage of electrically-alterable system startup bootstrap programs. Another usage of the $E^2PROM/RAM$ circuit is in fault-tolerant system or circuit designs to add or delete components, or to provide a nonvolatile address map of good and bad devices.

Although the invention has been described specifically with reference to a particular circuit embodiment which itself uses device parameters typical of a 5-volt n-channel MOS device and adapted to provide a specified 25 volt pulse having a regulated rise time of about a millisecond, many variations, adaptations and modifications will become apparent from the present disclosure, and are intended to be within the spirit and scope of the present invention as defined by the accompanying claims.

Various features of the invention are set forth in the following claims.

What is claimed is:

1. A nonvolatile electrically-alterable integrated circuit memory device comprising
    means for receiving a low level power supply for said device,
    recall command terminal means for receiving an external recall command signal,
    store command terminal means for receiving an external store command signal,
    memory array means for storing data comprising a plurality of addressable volatile memory cells for storing binary data and a plurality of nonvolatile memory cells associated with said random access memory cells, said nonvolatile memory cells being adapted to copy data from the volatile cells associated therewith upon application of a high voltage store signal thereto, and said volatile memory cells being adapted to copy data from said nonvolatile memory cells respectively associated therewith upon application of low level power supply potential to said volatile memory cells,
    high voltage generator means responsive to a signal applied to said store command terminal for utilizing said low level power supply for generating a high voltage pulse signal for effecting transfer of data from said volatile to said nonvolatile memory cells,
    recall means responsive to a signal applied to said recall command terminal means for effecting the copying of data by said memory array means from at least one of said nonvolatile cells to at least one of said volatile cells, and
    power supply switch means for sensing the low level power supply potential, and for preventing operation of said recall means, for preventing application of a high voltage pulse from said generator means to said memory array means, and for preventing the application of said low level potential to said memory array means unless said potential is within a predetermined operable range.

2. A device in accordance with claim 1 wherein said power supply means provides a potential to said device of about 5 volts or less, and wherein said high voltage generator means provides a high voltage pulse of at least about 20 volts.

3. A device in accordance with claim 1 including means for recalling a single, addressed bit of nonvolatile memory into the associated random access memory cell.

4. A device in accordance with claim 1 further comprising I/O terminal means for inputting data to, and for outputting data from said device.

5. A device in accordance with claim 1 wherein said external power supply means comprises a ground terminal for receiving a ground potential and a positive potential terminal for receiving a low level voltage potential with respect to said ground potential.

6. The device of claim 1 wherein said integrated circuit is fabricated on a p-type silicon substrate in n-channel MOS configuration.

7. The device of claim 1 comprising means for generating a back bias potential for negatively biasing the substrate of said device.

8. The device of claim 7 wherein said back bias generator means provides an oscillating multi-phase output to generate clock signals to drive said high voltage generator means.

9. The device of claim 1 wherein said device is adapted to receive external TTL, ECL or high level MOS external control signals.

10. A device in accordance with claim 1 wherein said memory array means has an organization having an addressable bit width of 1, 4, 8, 16 or 32 bits.

11. The circuit of claim 1 wherein said external power supply terminal means comprises a back bias terminal for providing an externally supplied back bias potential for said substrate.

* * * * *